(12) United States Patent
Aoai et al.

(10) Patent No.: US 6,479,209 B1
(45) Date of Patent: Nov. 12, 2002

(54) POSITIVE PHOTOSENSITIVE COMPOSITION

(75) Inventors: Toshiaki Aoai, Shizuoka (JP); Kenichiro Sato, Shizuoka (JP); Morio Yagihara, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/075,246

(22) Filed: May 11, 1998

(30) Foreign Application Priority Data

May 9, 1997 (JP) ............................................. 9-119772
May 9, 1997 (JP) ............................................. 9-119773

(51) Int. Cl.$^7$ ............................ G03C 1/73; G03F 7/039
(52) U.S. Cl. ............................... 430/270.1; 430/287.1; 430/905; 430/910; 430/326
(58) Field of Search ...................... 430/270.1, 285.1, 430/283.1, 286.1, 287.1, 284.1, 326, 905, 910.914

(56) References Cited

U.S. PATENT DOCUMENTS

| | | | |
|---|---|---|---|
| 5,252,427 A | 10/1993 | Bauer et al. | 430/270.1 |
| 5,585,222 A | 12/1996 | Kaimoto et al. | 430/270.1 |
| 5,621,019 A | 4/1997 | Nakano et al. | 522/49 |
| 5,843,624 A | * 12/1998 | Houlihan et al. | 430/270.1 |
| 5,863,699 A | * 1/1999 | Asakawa et al. | 430/270.1 |
| 6,042,991 A | * 3/2000 | Aoai et al. | 430/285.1 |

FOREIGN PATENT DOCUMENTS

| | | |
|---|---|---|
| DE | 195 25 221 A1 | 1/1996 |
| DE | 196 26 003 A1 | 1/1997 |
| EP | 0 663 616 A2 | 7/1995 |
| EP | 0 689 098 A1 | 12/1995 |
| EP | 0789278 A2 * | 8/1997 |
| EP | 0 849 634 A1 | 6/1998 |
| EP | 0 856 773 A1 | 8/1998 |
| JP | 05 265212 A | 10/1993 |
| JP | 05 297591 A * | 11/1993 |
| WO | 97 33198 | 9/1997 |

OTHER PUBLICATIONS

Machine–Assisted English Translation of JP 5–297591 (Nozaki et al) (Published on Dec. 1993) Provided by Japan Patent Office.*
Nozaki et al. Accession No. JP405297591A, File JPAB, English abstractn of JP 05297591 Published Nov. 12, 1993.*
Nozaki et al Accession No. 1993–397981. On line Derwent Abstract, File DWPI, English Abstract of JP 05297591 pUblished Nov 12, 1993.*

* cited by examiner

Primary Examiner—Janet Baxter
Assistant Examiner—Sin J. Lee
(74) Attorney, Agent, or Firm—Sughrue Mion, PLLC

(57) ABSTRACT

Disclosed is a positive photosensitive composition capable of giving good sensitivity, resolution and resist pattern and exhibiting sufficiently high dry etching resistance on use of an exposure light source of 250 nm or less, particularly 220 nm or less, which composition comprises (A) a compound generating an acid on irradiation of an active light ray or radiation and (B) a resin having (i) at least one polycyclic-type alicyclic group, (ii) at least one ester group which decomposes by the action of an acid and increases the solubility in an alkali developer and (iii) at least one acetal group which decomposes by the action of an acid and increases the solubility in an alkali developer, or comprises (A) a compound generating an acid on irradiation of an active light ray or radiation, (C) a resin having a polycyclic-type alicyclic group and an ester group which decomposes by the action of an acid and increases the solubility in an alkali developer, and (D) a resin having a polycyclic-type alicyclic group and an acetal group which decomposes by the action of an acid and increases the solubility in an alkali developer.

14 Claims, No Drawings

POSITIVE PHOTOSENSITIVE COMPOSITION

FIELD OF THE INVENTION

The present invention relates to a positive photosensitive composition for use in the production process of a semiconductor such as IC, in the production of a circuit board such as liquid crystal and thermal head and in other photofabrication processes, more specifically, the present invention relates to a positive photosensitive composition suitably used when the exposure light source used is a far ultraviolet beam of 250 nm or less.

BACKGROUND OF THE INVENTION

The positive photoresist composition commonly used is a composition comprising an alkali-soluble resin and a naphthoquinonediazide compound as a photosensitive material. Examples thereof include a "novolak-type phenol resin/naphthoquinonediazide-substituted compound" described in U.S. Pat. Nos. 3,666,473, 4,115,128 and 4,173,470 and a "novolak resin comprising cresol-formaldehyde/trihydroxybenzophenone-1,2-naphthoquinonediazide sulfonic acid ester" as a most typical composition, described in L. F. Thompson, *Introduction to Microlithography*, No. 2. 19, pp. 112–121, ACS Shuppan.

In these positive photoresists fundamentally comprising a novolak resin and a quinonediazide compound, the novolak resin exhibits high resistance against plasma etching and the naphthoquinonediazide compound acts as a dissolution inhibitor. The naphthoquinonediazide generates a carboxylic acid on irradiation of light and loses its dissolution inhibiting ability to thereby elevate the alkali solubility of the novolak resin.

From this viewpoint, a large number of positive photoresists comprising a novolak resin and a naphthoquinonediazide-base photosensitive material have heretofore been developed and used in practice, and satisfactory effects can be successfully attained in the working for the line width of approximately from 0.8 to 2 μm.

However, integrated circuits are being more and more intensified in the integration degree and the production of a semiconductor substrate such as VLSI requires working of an ultrafine pattern comprising lines having a width of a half micron or less.

According to one of known techniques for achieving miniaturization of a pattern, a resist pattern is formed using an exposure light source having a shorter wavelength. This technique can be described using the following Rayleigh's formula for the resolution R (line width) of an optical system:

$$R = k \cdot \lambda / NA$$

(wherein λ is a wavelength of the exposure light source, NA is a numerical aperture of the lens and k is a process constant). As known from this formula, a higher resolution, namely, a smaller R value can be obtained by reducing the wavelength λ of the exposure light source.

For example, in the production of a DRAM having an integration degree up to 64 M bits, the i-line (365 nm) of a high-pressure mercury lamp is used at present as the light source. In the mass production process of 256-M bit DRAMs, use of a KrF excimer laser (248 nm) in place of the i-line is being studied. Further, for producing DRAMs having an integration degree of 1 G bits or more, a light source having a further shorter wavelength is being studied. To this effect, an ArF excimer laser (193 nm), an $F_2$ excimer laser (157 nm), an X ray, an electron beam and the like are considered to be effective (see, Takumi Ueno et al., *Tanhacho Photoresist Material-Fine Working Toward ULSI-*, Bunshin Shuppan (1988).

When a conventional resist comprising a novolak and a naphthoquinonediazide compound is used for the lithography pattern formation using far ultraviolet light or excimer laser light, the novolak and naphthoquinonediazide exhibit strong absorption in the far ultraviolet region and the light scarcely reaches the resist bottom, as a result, only a tapered pattern having low sensitivity can be obtained.

One of the techniques for solving this problem is the chemical amplification-type resist composition described in U.S. Pat. No. 4,491,628 and European Patent No. 249,139. The chemical amplification-type positive resist composition is a pattern formation material which produces an acid in the exposed area on irradiation of radiation such as far ultraviolet light and due to the reaction using this acid as a catalyst, differentiates the solubility in the developer between the area irradiated with the active radiation and the non-irradiated area to form a pattern on a substrate.

Examples thereof include combinations of a compound capable of generating an acid by the photolysis with an acetal or O,N-acetal compound-(see, JP-A-48-89003 (the term "JP-A" as used herein means an "unexamined published Japanese patent application"), with an ortho ester or amide acetal compound (JP-A-51-120714), with a polymer having an acetal or a ketal group on the main chain (JP-A-53-133429), with an enol ether compound (JP-A-55-12995), with an N-acyliminocarbonic acid compound (JP-A-55-126236), with a polymer having an ortho ester group on the main chain (JP-A-56-17345), with a tertiary alkyl ester compound (JP-A-60-3625), with a silyl ester compound (JP-A-60-10247) or with a silyl ether compound (JP-A-60-37549, JP-A-60-121446). These combinations in principle have a quantum yield exceeding 1 and therefore exhibit high photosensitivity.

A system where the composition is decomposed by heating in the presence of an acid and alkali-solubilized is also used and examples thereof include combination systems of a compound capable of generating an acid on exposure with an ester or carbonic acid ester compound of tertiary or secondary carbon (e.g., t-butyl, 2-cyclohexenyl) described in JP-A-59-45439, JP-A-60-3625, JP-A-62-229242, JP-A-63-27829, JP-A-63-36240, JP-A-63-250642, JP-A-5-181279, *Polym. Eng. Sce.*, Vol. 23, page 1012 (1983), *ACS. Sym.*, Vol. 242, page 11 (1984), *Semiconductor World November*, 1987, page 91, *Macromolecules*, Vol. 21, page 1475 (1988), and *SPIE*, Vol. 920, page 42 (1988), with an acetal compound described in JP-A-4-219757, JP-A-5-249682 and JP-A-6-65332, or with a t-butyl ether compound described in JP-A-4-211258 and JP-A-6-65333.

These systems mainly comprise a resin having a basic skeleton of poly(hydroxystyrene) which is small in the absorption in the region of 248 nm and therefore, when the exposure light source is a KrF excimer laser, they are highly sensitive, have high resolution and form a good pattern.

However, when the light source has a further shorter wavelength, for example, when the exposure light source used is an ArF excimer laser (193 nm), the above-described chemical amplification type systems are deficient because the compound having an aromatic group substantially exhibits large absorption in the region of 193 nm.

As the polymer having small absorption in the 193 nm-wavelength region, *J. Vac. Sci. Technol.*, B9, 3357

(1991) describes the use of poly(meth)acrylate, however, this polymer has a problem that the resistance against the dry etching which is commonly performed in the production process of semiconductors is low as compared with conventional phenol resins having an aromatic group.

*Proc. of SPIE,* 1672, 66 (1922) has reported that polymers having an alicyclic group exhibit a dry etching resistant property on the same level as that of the compound having an aromatic group and at the same time, has small absorption in the 193 nm region, and use of these polymers is being aggressively studied in-recent-years. Specific examples thereof include the polymers described in JP-A-4-39665, JP-A-5-80515, JP-A-5-265212, JP-A-5-297591, JP-A-5-346668, JP-A-6-289615, JP-A-6-324494, JP-A-7-49568, JP-A-7-185046, JP-A-7-191463, JP-A-7-199467, JP-A-7-234511, JP-A-7-252324 and JP-A-8-259626. These polymers, however, are not necessarily satisfied in their resistance against the dry etching. Further, this technique is deficient in that the pattern profile which is described below, namely, the shape and quality of the resist pattern formed are insufficient, and it is still in need of improvements.

The above-described positive chemical amplification resist is roughly classified into a three-component system comprising an alkali-soluble resin, a compound capable of generating an acid on exposure to radiation (photo acid generator) and a dissolution inhibiting compound for the alkali-soluble resin having an acid decomposable group, and a two-component system comprising a resin having a group which decomposes on the reaction with an acid and becomes alkali soluble, and a photo acid generator.

These two-component or three-component system positive chemical amplification resists undergo decomposition by the heat treatment in the presence of an acid produced from the photo acid generator on exposure and form a resist pattern by the development. As the standing time from exposure to heat treatment (PEB treatment) increases, the acid generated may diffuse or the acid on the resist surface part may be deactivated due to the basic impurities in the atmosphere, as a result, the sensitivity and the profile (T-top form) or line width of the resist pattern after the development may be disadvantageously varied. In particular, when the acid decomposable group is a group having a relatively large acid decomposition activating energy, such as t-BOC group and t-butyl ester group, the sensitivity is reduced and the T-top formation is greatly inhibited. On the other hand, in the case of a group having a small acid decomposition activating energy, such as acetal group, tetrahydropyranyl ether group and silyl ether group, the above-described problems may not be serious but the line width of the pattern is reduced, moreover, due to the phenolic OH group produced from these groups on the acid decomposition, the dissolution accelerating effect is not sufficiently provided and thereby, discrimination in the dissolution between before and after the exposure is not clear, as a result, the resolution, defocus latitude and the like are still left deficient.

In order to solve these problems, JP-B-2-27660 (the term "JP-B" as used herein means an "examined Japanese patent publication"), JP-A-5-181279, JP-A-6-83059, JP-A-6-282073 and European Patent No. 366,590 disclose a technique of using a group which generates a carboxylic acid from the acid produced.

However, this technique has not yet succeeded in improving changes in the pattern form (T-top form) or fluctuation (reduction) in the sensitivity.

Further, a technique of using a resin which is readily decomposed by the action of an acid (namely, the acid decomposition activating energy is small) and has a group difficult to cause changes in the pattern form and fluctuation in the sensitivity is disclosed in JP-A-2-25850, JP-B-3-44290, JP-A-4-211258, JP-A-5-19482, JP-A-5-249682, JP-A-6-167811, JP-A-6-273934 and European Patent 447,868.

According to this technique, however, the dissolution accelerating effect is not provided and the solubility in an alkali developer after the exposure is insufficient, as a result, resolution and pattern profile of a satisfactory level cannot be obtained.

In the positive chemical amplification resist, the photo acid generator also greatly affects the pattern formation characteristics and accordingly, improvements of sensitivity, resolution and pattern profile have been studied from the aspect of the photo acid generator technology. Heretofore, N-imidosulfonate, N-oximsulfonate, o-nitrobenzyl sulfonate, trismethane sulfonate of pyrogallol and the like have been developed. Further, sulfonium and iodonium are known to have large photodecomposition efficiency and excellent image forming property. As the salt corresponding thereto, perfluoro Lewis acid salts such as $PF_6^-$, $AsF_6^-$ and $SbF_6^-$, trifluoromethanesulfonic acid anion and toluenesulfonic acid anion are known. Furthermore, in view of improving also the solvent solubility, benzenesulfonic acid, naphthalenesulfonic acid or anthracenesulfonic acid having one linear alkyl group or alkoxy group is disclosed. However, these all have not yet succeeded in overcoming their defects such as contamination by the counter anion element or reduction in the line width of the resist pattern due to aging after exposure until heat treatment. In particular, a photo acid generator suitable for the ArF light source has not yet been obtained.

SUMMARY OF THE INVENTION

As described in the foregoing, conventional techniques cannot respond to the increasing demand for a photosensitive composition which can satisfy both the resistance against dry etching and the quality of the resist pattern in the case of using an exposure light source having a wavelength in the far ultraviolet region. Under these circumstances, the object of the present invention is to provide a positive photosensitive composition suitable for the exposure using a light source of 250 nm or less, particularly 220 nm or less. More specifically, the object of the present invention is to provide a positive photosensitive composition capable of giving good sensitivity, resolution and a resist pattern on use of an exposure light source of 250 nm or less, particularly 220 nm or less, and further exhibiting sufficiently high resistance against dry etching.

As a result of extensive investigations while taking notice of the above-described various properties, the present inventors have found that the object of the present invention can be attained by using one or two of the resins described below having both a group which decomposes by the action of a specific acid, and a polycyclic-type alicyclic group. The present invention has been accomplished based on this finding.

More specifically, the present invention has the following constructions.

(1) A positive photosensitive composition comprising:
   (A) a compound generating an acid on irradiation of an active light ray or radiation, and
   (B) a resin having (i) at least one polycyclic-type alicyclic group, (ii) at least one group which decomposes by the action of an acid represented by formula (I) and increases the solubility in an alkali developer, and (iii) at least one group which decomposes by the action of an acid represented by formula (II) and increases the solubility in an alkali developer:

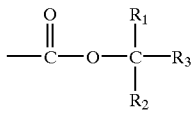
(I)

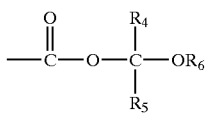
(II)

wherein $R_1$ to $R_5$, which may be the same or different, each represents a hydrogen atom or an alkyl group, cycloalkyl group, alkenyl group, acyl group or alkoxycarbonyl group which may have a substituent, and $R_6$ represents an alkyl group, cycloalkyl group or alkenyl group which may have a substituent, provided that two of $R_1$ to $R_3$ in formula (I) or two of $R_4$ to $R_6$ in formula (II) may be combined to form a ring structure comprising from 3 to 8 carbon atoms or heterocyclic atoms.

(2) The positive photosensitive composition as described in (1) above, wherein the resin as component (B) is a resin containing (i) a repeating structural unit having a polycyclic-type alicyclic group, (ii) at least one repeating structural unit represented by formula (III), (IV) or (V), and (iii) at least one repeating structural unit represented by formula (VI), (VII) or (VIII):

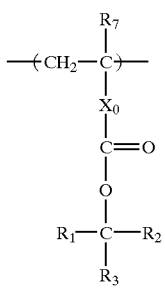
(III)

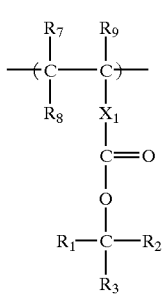
(IV)

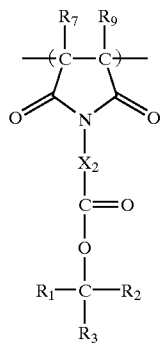
(V)

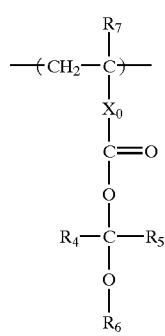
(VI)

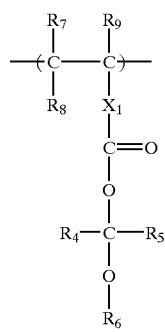
(VII)

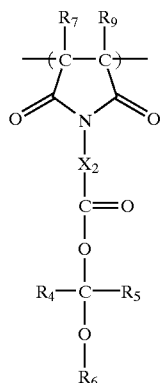
(VIII)

wherein $R_7$ and $R_9$, which may be the same or different, each represents a hydrogen atom, a halogen atom, a cyano group, an alkyl group or a haloalkyl group; $R_8$ represents a cyano group, —CO—$OR_{10}$ or —CO—$NR_{11}R_{12}$; $R_{10}$ to $R_{12}$, which may be the same or different, each represents a hydrogen atom or an alkyl group, cycloalkyl group or alkenyl group which may have a substituent, and $R_{11}$ and $R_{12}$ may be combined to form a ring; $X_0$ to $X_2$, which may be the same or different, each represents a single bond or a divalent alkylene group, alkenylene group or cycloalkylene group which may have a substituent, —O—, —SO$_2$—, —O—CO—$R_{13}$—, —CO—O—$R_{14}$— or —CO—NR$_{15}$—$R_{16}$—; $R_{13}$, $R_{14}$ and $R_{16}$, which may be the same or different, each represents a single bond or a divalent alkylene group, alkenylene group or cycloalkylene group, and these groups each may form a divalent group together with an ether group, an ester group, an amido group, a urethane group or a ureido group; $R_{15}$ represents a hydrogen atom or an alkyl group, cycloalkyl group or alkenyl group which may have a substituent; and $R_1$ to $R_6$ have the same meanings as described in (1) above.

(3) The positive photosensitive composition as described in (1) or (2) above, wherein the resin as component (B) further has a carboxyl group.

(4) The positive photosensitive composition as described in (3) above, wherein the resin as component (B) is a resin further containing at least one repeating structural unit represented by formula (IX), (X) or (XI) having a carboxyl group:

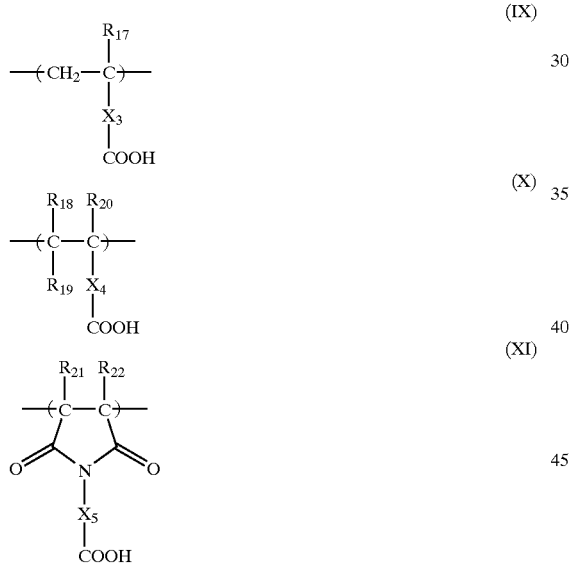

wherein $R_{17}$, $R_{18}$ and $R_{20}$ to $R_{22}$, which may be the same or different, each represents a hydrogen atom, a halogen atom, a cyano group, an alkyl group or a haloalkyl group; $R_{19}$ represents a cyano group, a carboxyl group, —CO—OR$_{23}$ or —CO—NR$_{24}$R$_{25}$; $X_3$ to $X_5$, which may be the same or different, each represents a single bond, a divalent alkylene group, alkenylene group or cycloalkylene group which may have a substituent, —O—, —SO$_2$—, —O—CO—$R_{26}$—, —CO—O—$R_{27}$— or —CO—NR$_{28}$—$R_{29}$—; $R_{23}$ represents an alkyl group, cycloalkyl group or alkenyl group which may have a substituent; $R_{24}$, $R_{25}$ and $R_{28}$, which may be the same or different, each represents a hydrogen atom or an alkyl group, cycloalkyl group or alkenyl group which may have a substituent and $R_{24}$ and $R_{25}$ may be combined to form a ring; and $R_{26}$, $R_{27}$ and $R_{29}$, which may be the same or different, each represents a single bond, a divalent alkylene group, alkenylene group or cycloalkylene group, and these groups each may further form a divalent group together with an ether group, an ester group, an amido group, a urethane group or a ureido group.

(5) The positive photosensitive composition as described in any one of (1) to (4) above, further comprising a low molecular acid decomposable dissolution inhibiting compound having a group capable of decomposition by the action of an acid, being increased in the solubility in an alkali developer by the action of an acid and having a molecular weight of 3,000 or less.

(6) The positive photosensitive composition as described in any one of (1) to (5) above, which is used for an exposure using a far ultraviolet light of 250 nm or less as the exposure light source.

(7) The positive photosensitive composition as described in (6) above, which is used for an exposure using a far ultraviolet light of 220 nm or less as the exposure light source.

(8) A positive photosensitive composition comprising (A) a compound generating an acid on irradiation of an active light ray or radiation, (C) a resin having a polycyclic-type alicyclic group and a group which decomposes by the action of an acid represented by formula (I) and increases the solubility in an alkali developer, and (D) a resin having a polycyclic-type alicyclic group and a group which decomposes by the action of-an acid represented by formula (II) and increases the solubility in an alkali developer.

(9) The positive photosensitive composition as described in (8) above, wherein the resin as component (C) is a resin containing a repeating structural unit having a polycyclic-type alicyclic group and at least one repeating structural unit represented by formula (III), (IV) or (V), and the resin as component (D) is a resin containing a repeating structural unit having a polycyclic-type alicyclic group and at least one repeating structural unit represented by formula (VI), (VII) or (VIII).

(10) The positive photosensitive composition as described in (8) or (9) above, wherein either one or both of resins as components (C) and (D) further has a carboxyl group.

(11) The positive photosensitive composition as described in (10) above, wherein either one or both of resins as components (C) and (D) further contains at least one repeating structural unit represented by the following formula (IX), (X) or (XI) having a carboxyl group.

(12) The positive photosensitive composition as described in any one of (8) to (11) above, further comprising a low molecular acid decomposable dissolution inhibiting compound having a group capable of decomposition by the action of an acid, being increased in the solubility in an alkali developer by the action of an acid and having a molecular weight of 3,000 or less.

(13) The positive photosensitive composition as described in any one of (8) to (12) above, which is used for an exposure using a far ultraviolet light of 250 nm or less as the exposure light source.

(14) The positive photosensitive composition as described in (13) above, which is used for an exposure using a far ultraviolet light of 220 nm or less as the exposure light source.

DETAILED DESCRIPTION OF THE INVENTION

The compounds for use in the present invention are described in detail below.

The resin contained as component (B) in the positive photosensitive composition of the present invention, having (i) a polycyclic-type alicyclic group, (ii) a group which decomposes by the action of an acid represented by formula (I) and increases the solubility in an alkali developer (sometimes referred to as an acid decomposable group), and (iii) a group which decomposes by the action of an acid represented by formula (II) and increases the solubility in an alkali developer; resin (C) having a polycyclic-type alicyclic group and a group which decomposes by the action of an acid represented by formula (I) and increases the solubility in an alkali developer; and resin (D) having a polycyclic-type alicyclic group and a group which decomposes by the action of an acid represented by formula (II) and increases the solubility in an alkali developer are described below.

In the present invention, the acid decomposable groups represented by formulae (I) and/or (II) and the polycyclic-type alicyclic group each can be bonded to any site in the mother resin. More specifically, one or more acid decomposable groups represented by respective formulae (I) and/or (II) and the polycyclic-type alicyclic group may be bonded to different repeating units in the mother resin or bonded to the same repeating unit, or these two cases may be present together in the resin. Respective structural units are described below.

[1] Repeating Structural Unit Having Acid Decomposable Group

Resin (B) for use in the present invention may be any as long as it contains the groups represented by formula (I) and formula (II). The group belonging to formula (I) preferably contains a repeating unit represented by formula (III), (IV) or (V) and the group belonging to formula (II) preferably contains a repeating unit represented by formula (VI) or (VIII).

Further, in resin (C) and resin (D) for use in the present invention, the repeating structural unit having a group represented by formula (I) or (II) may be any as long as it has a group represented by formula (I) or (II). In the case of the group belonging to formula (I), a repeating unit represented by formula (III), (IV) or (V) is preferred and in the case of the group belonging to formula (II), a repeating unit represented by formula (VI) or (VIII) is preferred.

The alkyl group represented by $R_1$, $R_2$, $R_3$, $R_4$ or $R_5$ in the formulae is preferably an alkyl group having from 1 to 8 carbon atoms, which may have a substituent, such as methyl group, ethyl group, propyl group, n-butyl group, sec-butyl group, hexyl group, 2-ethylhexyl group and octyl group. The cycloalkyl group is preferably a cycloalkyl group having from 3 to 8 carbon atoms, which may have a substituent, such as cyclopropyl group, cyclopentyl group and cyclohexyl group. The alkenyl group is preferably an alkenyl group having from 2 to 6 carbon atoms, which may have a substituent, such as vinyl group, propenyl group, allyl group, butenyl group, pentenyl group, hexenyl group and cyclohexenyl group.

The acyl group is preferably an acyl group having from 1 to 10 carbon atoms, such as formyl group, acetyl group, propanoyl group, butanoyl group and octanoyl group. The alkoxycarbonyl group is preferably an alkoxycarbonyl group having from 2 to 8 carbon atoms, such as methoxycarbonyl group, ethoxycarbonyl group, propoxycarbonyl group and butoxycarbonyl group.

The alkyl group, the cycloalkyl group and the alkenyl group represented by $R_6$ each has the same preferred embodiment as those represented by $R_1$, $R_2$, $R_3$, $R_4$ or $R_5$ above. In the case where $R_1$, $R_2$, $R_3$, $R_4$, $R_5$ or $R_6$ each has a substituent, preferred examples of the substituent include a hydroxyl group, a halogen atom (fluorine, chlorine, bromine, iodine), a nitro group, a cyano group, an amido group, a sulfonamido group, an alkoxy group having rom 1 to 8 carbon atoms, such as methoxy group, ethoxy group, propoxy group and butoxy group, the above-described alkyl groups for $R_1$, $R_2$, $R_3$, $R_4$ or $R_5$, an alkoxycarbonyl group, an acyl group and a cycloalkyl group.

In the case where any two of $R_1$ to $R_5$ and $R_6$ on the same carbon atom are combined with each other to form a ring, preferred examples of the ring include 3- to 8-membered rings which may contain a hetero atom, such as cyclopropyl group, cyclopentyl group, cyclohexyl group, cycloheptyl group, tetrahydrofuranyl group and tetrahydropyranyl group. These rings each may further have the above-described substituent.

The alkyl group represented by $R_7$, $R_9$, $R_{10}$, $R_{11}$, $R_{12}$ or $R_{15}$ is preferably an alkyl group having from 1 to 4 carbon atoms, which may have a substituent, such as methyl group, ethyl group, propyl group, n-butyl group and sec-butyl group. The haloalkyl group is preferably an alkyl group having from 1 to 4 carbon atoms and substituted by a fluorine atom, a chlorine atom or a bromine atom, such as fluoromethyl group, chloromethyl group, bromomethyl group, fluoroethyl group, chloroethyl group and bromoethyl group.

The alkylene group represented by $X_0$, $X_1$ or $X_2$ is preferably an alkylene group having from 1 to 8 carbon atoms, which may have a substituent, such as methylene group, ethylene group, propylene group, butylene group, hexylene group and octylene group. The alkneylene group is preferably an alkenylene group having from 2 to 6 carbon atoms, which may have a substituent, such as ethenylene group, propenylene group and butenylene group. The cycloalkylene group is preferably a cycloalkylene group having from 5 to 8 carbon atoms, which may have a substituent, such as cyclopentylene group and cyclohexylene group. Specific examples of the alkylene group, the alkenylene group and the cycloalkylene group represented by $R_{13}$, $R_{14}$ or $R_{16}$ are the same as those described above and further include divalent groups formed by combining one of those groups with at least one of an ether group, an ester group, an amido group, a urethane group and a ureido group.

When $R_7$, $R_9$, $X_0$ to $X_2$ each has a substituent, examples of the substituent include an alkyl group having from 1 to 4 carbon atoms, such as methyl group, ethyl group and propyl group, a hydroxyl group, a halogen atom, a nitro group and an alkoxy group having from 1 to 8 carbon atoms, such as methoxy group, ethoxy group, propoxy group and butoxy group.

Specific-examples (a1) to (a17) of the repeating structural units represents by formulae (III) to (V) and specific examples (a18) to (a33) of the repeating structural units represented by formulae (VI) to (VIII) are set forth below, however, the present invention is by no means limited thereto.

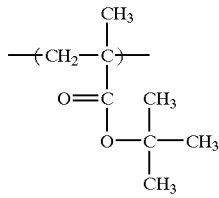

(a1)

(a2) 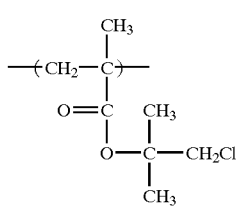
(a3) 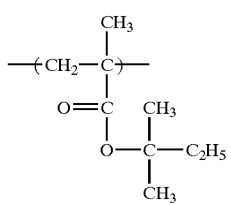
(a4) 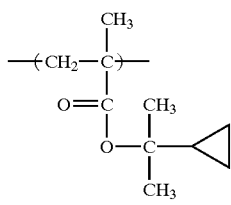
(a5) 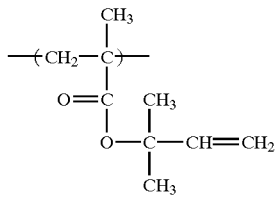
(a6) 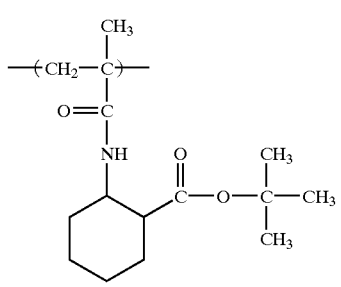
(a7) 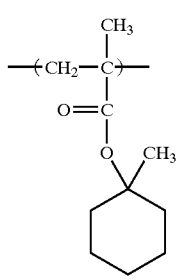
(a8) 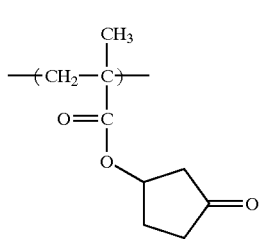
(a9) 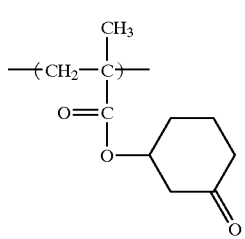
(a10) 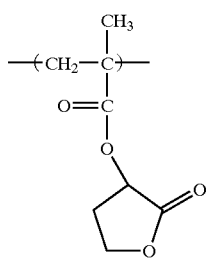
(a11) 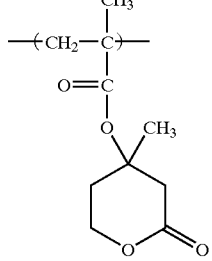
(a12) 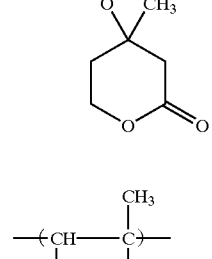
(a13) 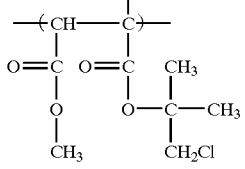
(a14) 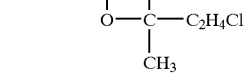
(a15) 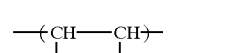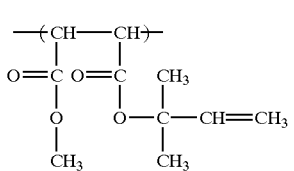

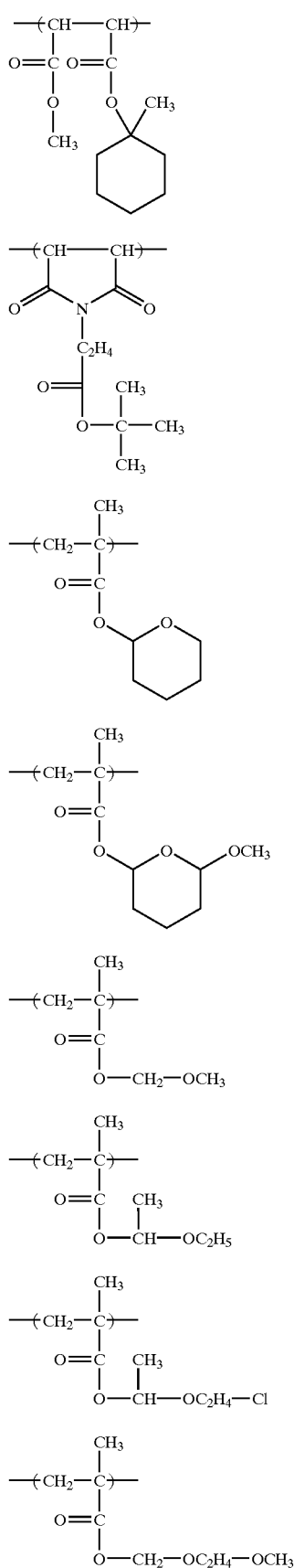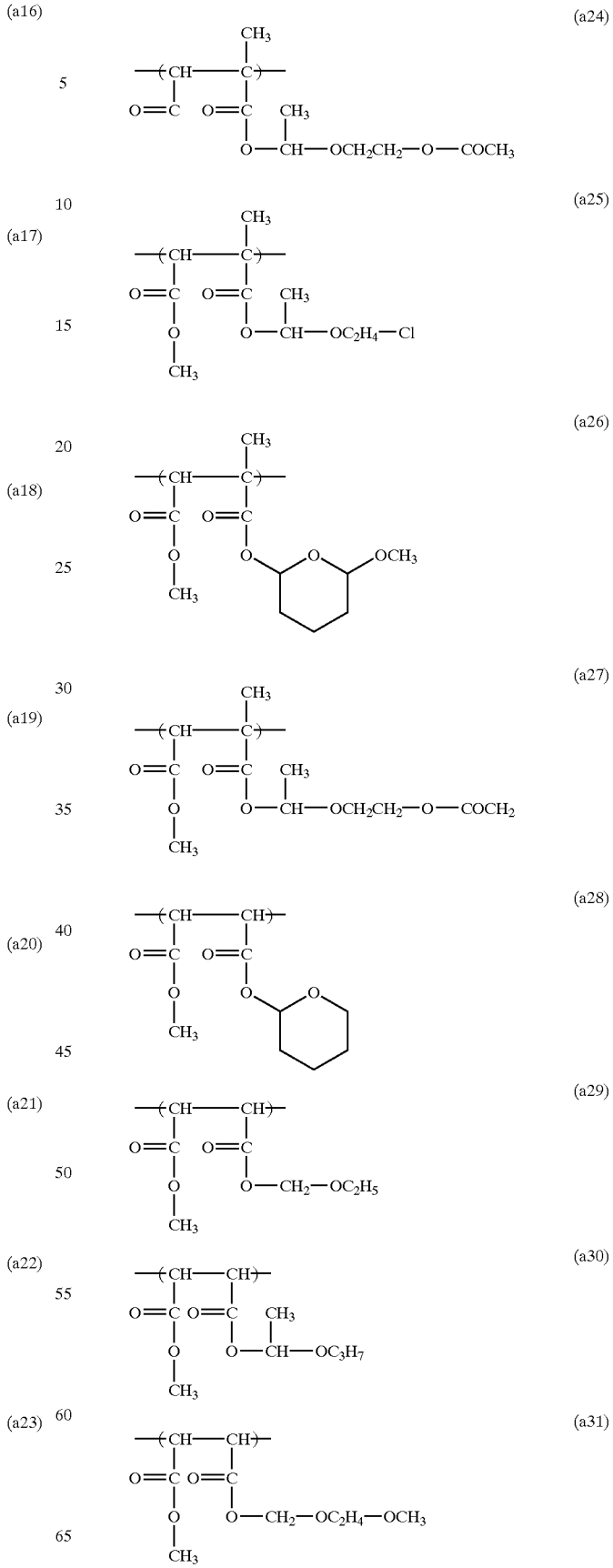

-continued (a32)
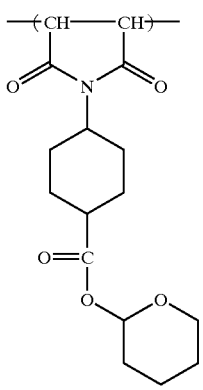

(a33)
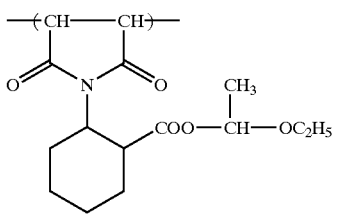

The content of each repeating structural unit (preferably the repeating structural units represented by formula (III), (IV) or (V), and formula (VI), (VII) or (VIII)) having the above-described acid decomposable group, in resin (B) for use in the present invention is adjusted by the capabilities such as alkali developing property or substrate adhesive property, however, it is preferably from 5 to 80 mol %, more preferably from 10 to 70 mol %, still more preferably from 20 to 60 mol %, based on all repeating units.

The molar ratio of the group represented by formula (I) to the group represented by formula (II) in resin (B) is selected so that the photosensitive composition prepared from the resin can have an optimal pattern profile, however, it is usually from 90:10 to 10:90, preferably from 20:80 to 80:20, more preferably from 40:60 to 60:40. The group represented by formula (I) (preferably the structural unit represented by formula (III), (IV) or (V)) has a low acid decomposition rate and the pattern profile is liable to have a T-top form, whereas the group represented by formula (II) (preferably the structural unit represented by formula (VI), (VII) or (VIII)) has a high acid decomposition rate and a ladder-shaped thin pattern profile is readily formed. A high-quality pattern profile can be realized by allowing these two kinds of groups to be present in the same resin and controlling the ratio therebetween and this is a great advantage of the present invention.

The content of the repeating structural unit (preferably the repeating structural unit represented by formula (III), (IV) or (V) or formula (VI), (VII) or (VIII)) having the above-described acid decomposable group, in resin (C) or (D) for use in the present invention is adjusted depending on the capabilities such as alkali developability and substrate adhesive property, however, it is preferably from 5 to 80 mol %, more preferably from 10 to 70 mol %, still more preferably from 20 to 60 mol %, based on all repeating units. The content of the acid decomposable group-containing repeating structural unit as used herein means the amount of all acid decomposable group-containing repeating structural units in the resin, inclusive of the acid decomposable group contained in the repeating structural unit having a group represented by formula (I) or (II).

The mixing ratio of resin (C) and resin (D) in the resist composition varies depending on the optimal point in exerting properties such as sensitivity and pattern profile, however, the ratio resin (C)/resin (D) is usually from 10/90 to 90/10, preferably from 20/80 to 80/20, more preferably from 40/60 to 60/40.

Resin (C) has a low acid decomposition rate and therefore, the resist layer surface is retarded to dissolve at the development of the photosensitive composition resist and the pattern profile is liable to have a T-top form, moreover, the sensitivity is readily reduced. Resin (D) has high sensitivity, however, due to its high acid decomposition rate, the resist pattern is excessively dissolved and thinned. By selecting appropriate mixing ratio of these two resins, a pattern profile having excellent quality can be realized, and this is a great advantage of the present invention.

[2] Repeating Structural Unit Having Alicyclic Group

The repeating structural unit having a polycyclic-type alicyclic group, which is contained in the resin as component (B) for use in the present invention together with the acid decomposable groups represented by formulae (I) and (II), and the repeating structural unit having a polycyclic-type alicyclic group, which is contained in each of resins (C) and (D) together with an acid decomposable group represented by formula (I) or (II), are descried below.

The repeating structural unit having an alicyclic group may be an it has a polycyclic-type alicyclic group. This unit can effectively exhibit resistance against dry etching.

The repeating structural unit having a polycyclic-type alicyclic group is preferably a repeating structural unit represented by the following formula (XII), (XIII) or (XIV):

 (XII)

 (XIII)

 (XIV)

wherein $R_{30}$, $R_{31}$ and $R_{33}$ to $R_{35}$, which may be the same or different, each represents a hydrogen atom, a halogen atom, a cyano group, an alkyl group or a haloalkyl group; $R_{32}$ represents a cyano group, a carboxyl group, —CO—O$R_{36}$ or —CO—N($R_{37}$)($R_{38}$); $X_6$ to $X_8$, which may be the same or different, each represents a single bond, a divalent alkylene group, a divalent cycloalkylene group, —O—, —SO$_2$—, —O—CO—$R_{39}$—, —CO—O—$R_{40}$ or —CO—N($R_{41}$)—$R_{42}$—; $R_{46}$ represents an alkyl group, a cycloalkyl group or an alkenyl group; $R_{37}$, $R_{38}$ and $R_{41}$, which may be the same or different, each represents a hydrogen atom, an alkyl group, a cycloalkyl group or an alkenyl group; $R_{37}$ and $R_{38}$ may be combined with each other to form a ring; $R_{39}$, $R_{40}$ and $R_{42}$, which may be the same or different, each represents a single bond, a divalent alkylene group or a divalent cycloalkylene group, and these divalent groups each may further form a divalent group together with an ether group, an ester group, an amido group, a urethane group or a ureido group; and Y represents a polycyclic-type alicyclic group.

The alkyl group represented by $R_{30}$, $R_{31}$, $R_{33}$, $R_{34}$ or $R_{35}$ is preferably an alkyl group having from 1 to 4 carbon atoms, which may have a substituent, such as methyl group, ethyl group, propyl group, n-butyl group or sec-butyl group. The haloalkyl group is preferably an alkyl group having from 1 to 4 carbon atoms substituted by a fluorine atom, a chlorine atom or a bromine atom, such as fluoromethyl group, chloromethyl group, bromomethyl group, fluoroethyl group, chloroethyl group or bromoethyl group.

The alkyl group represented by $R_{36}$, $R_{37}$, $R_{38}$ or $R_{41}$ is preferably an alkyl group having from 1 to 8 carbon atoms, which may have a substituent, such as methyl group, ethyl group, propyl group, n-butyl group, sec-butyl group, hexyl group, 2-ethylhexyl group or octyl group. The cycloalkyl group is a cycloalkyl group having from 3 to 8 carbon atoms, which may have a substituent, such as cyclopropyl group, cyclopentyl group or cyclohexyl group. The alkenyl group is preferably an alkenyl group having from 2 to 6 carbon atoms, which may have a substituent, such as vinyl group, propenyl group, allyl group, butenyl group, pentenyl group, hexenyl group or cyclohexenyl group.

The ring formed together with the nitrogen atom when $R_{37}$ and $R_{38}$ are combined is preferably a 5-, 6-, 7- or 8-membered ring, and specific examples thereof include pyrrolidine, piperidine and piperazine.

The alkylene group represented by $X_6$, $X_7$, $X_8$, $R_{40}$, $R_{41}$ or $R_{42}$ is an alkylene group having from 1 to 8 carbon atoms, which may have a substituent, such as methylene group, ethylene group, propylene group, butylene group, hexylene group or octylene group. The cycloalkylene group is preferably a cycloalkylene group having from 5 to 8 carbon atoms, which may have a substituent, such as cyclopentylene group or cyclohexylene group.

The polycyclic-type alicyclic group represented by Y is preferably an alicyclic group having 5 or more carbon atoms, which may have a substituent, such as bicyclo, tricyclo or tetracyclo alicyclic group, more preferably a polycyclic-type alicyclic group having from 6 to 30 carbon atoms, still more preferably from 7 to 25 carbon atoms, which may have a substituent.

Preferred examples of the substituent further for the above-described substituent include a hydroxyl group, a halogen atom (e.g., fluorine, chlorine, bromine, iodine), a nitro group, a cyano group, an amido group, a sulfonamido group, the alkyl groups described for $R_{30}$, $R_{31}$, $R_{33}$, $R_{34}$ or $R_{35}$, an alkoxy group such as methoxy group, ethoxy group, hydroxyethoxy group, propoxy group, hydroxypropoxy group and butoxy group, an alkoxycarbonyl group such as methoxycarbonyl group and ethoxycarbonyl group, an acyl group such as formyl group, acetyl group and propanoyl group, an acyloxy group such as acetoxy group and butyryloxy group, and a carboxy group.

Representative structures of the alicyclic moiety in the polycyclic-type alicyclic group for use in the present invention are set forth below.

 (1)

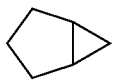 (2)

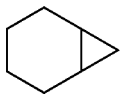 (3)

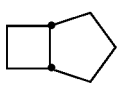 (4)

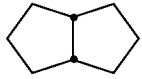 (5)

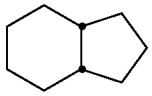 (6)

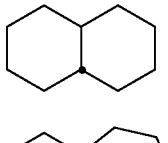 (7)

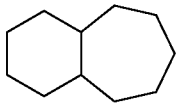 (8)

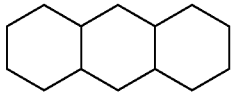 (9)

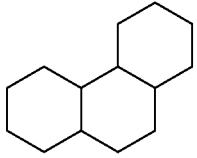 (10)

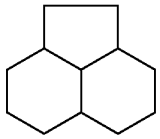 (11)

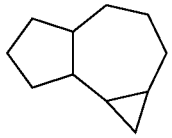 (12)

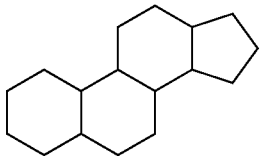 (13)

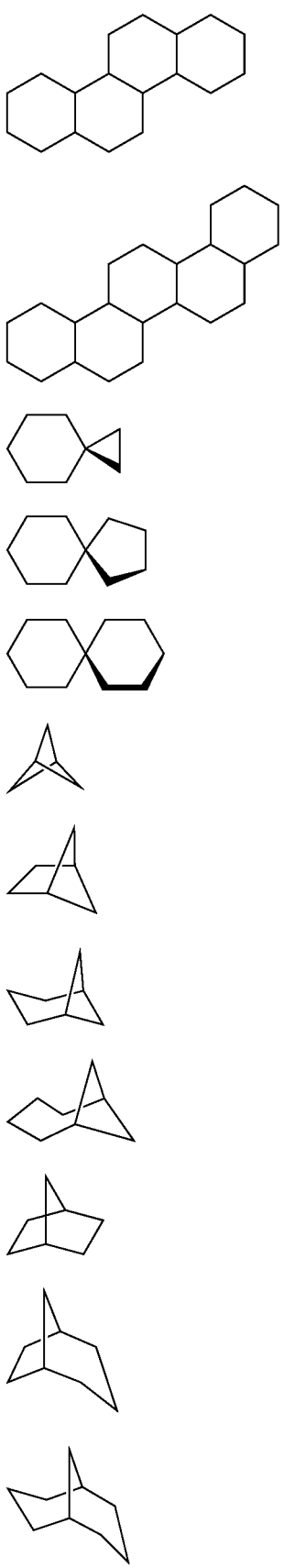
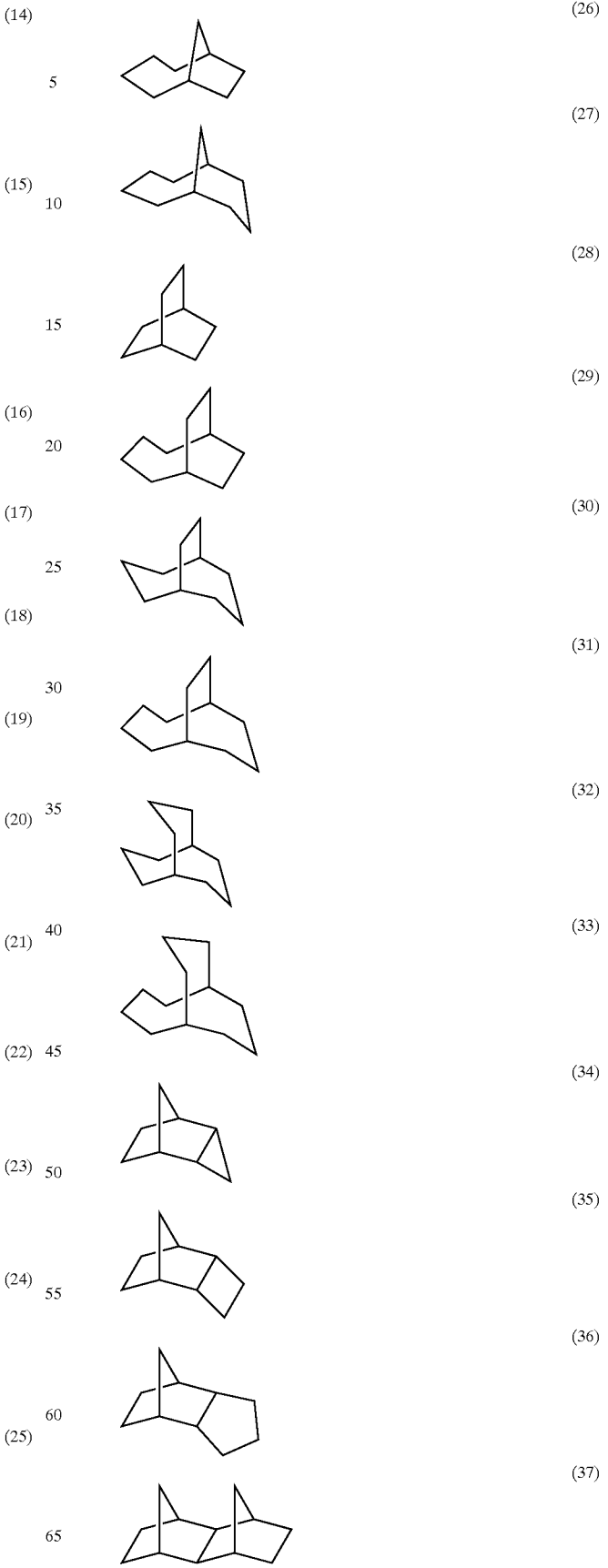

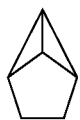 (38)

 (39)

 (40)

 (41)

 (42)

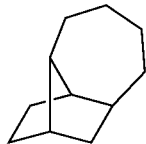 (43)

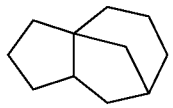 (44)

 (45)

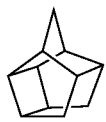 (46)

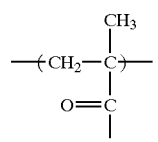 (b1)

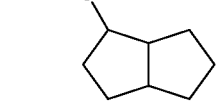 (b2)

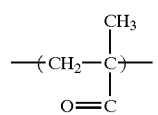 (b3)

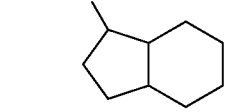 (b4)

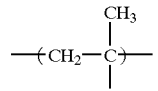

 (b5)

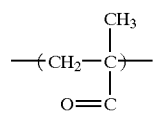

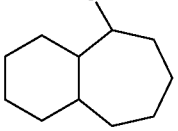

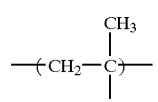 (b6)

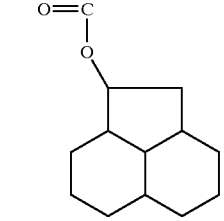

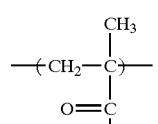

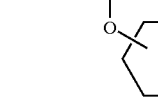

The content of the repeating structural unit represented by formula (XII), (XIII) or (XIV) having the above-described polycyclic-type alicyclic group, in the resin for use in the present invention is adjusted in view of the balance between the resistance against dry etching and the alkali developability, substrate adhesive property or the like, however, it is preferably 20 mol % or more, more preferably from 30 to 80 %, still more preferably from 35 to 70 mol %, based on all repeating units.

Specific examples [(b1) to (b42)] of the repeating structural unit represented by formula (XII), (XIII) or (XIV) are set forth below, however, the present invention is by no means limited thereto.

(b7) 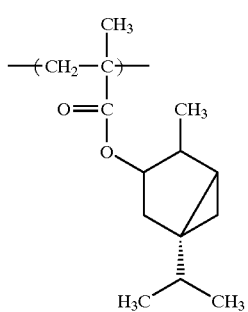
(b8) 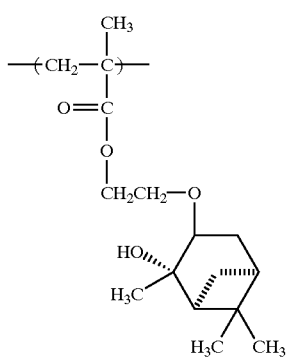
(b9) 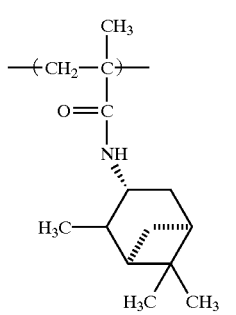
(b10) 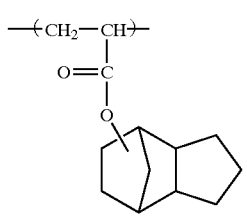
(b11) 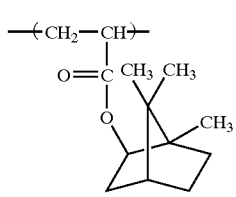
(b12) 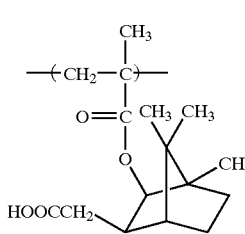
(b13) 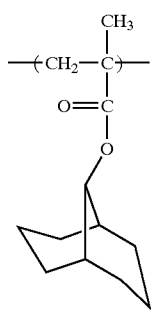
(b14) 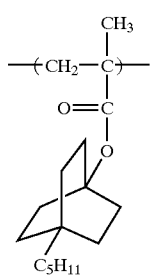
(b15) 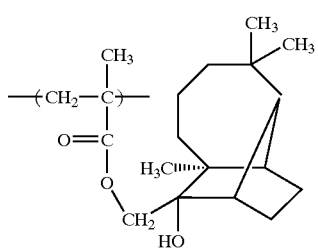
(b16) 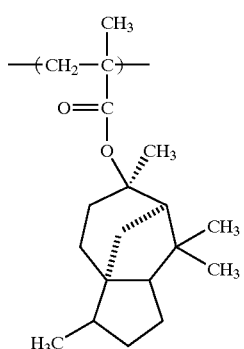
(b17) 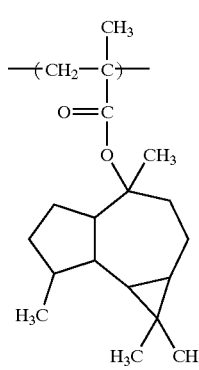

(b18) 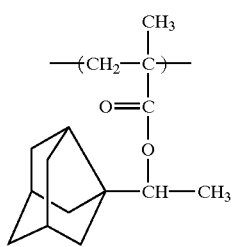
(b19) 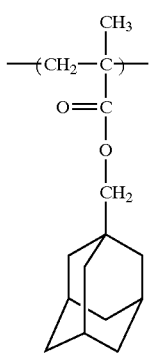
(b20) 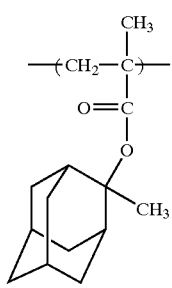
(b21) 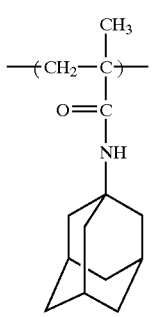
(b22) 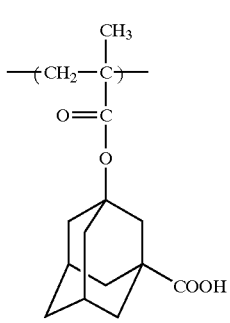
(b23) 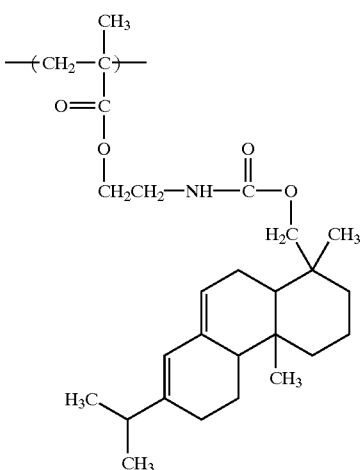
(b24) 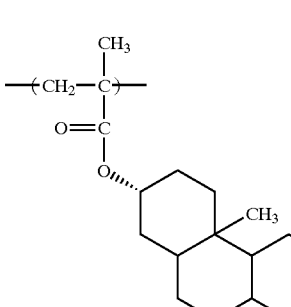
(b25) 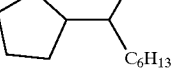

-continued
(b26)
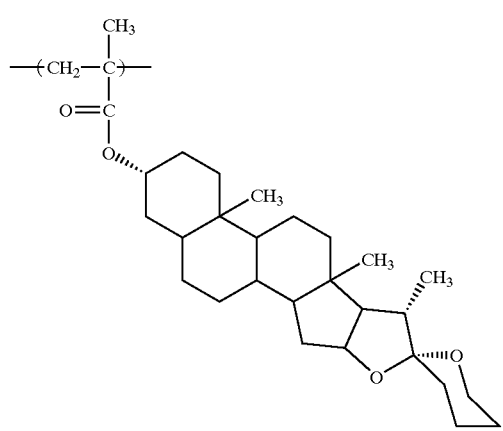
(b27)
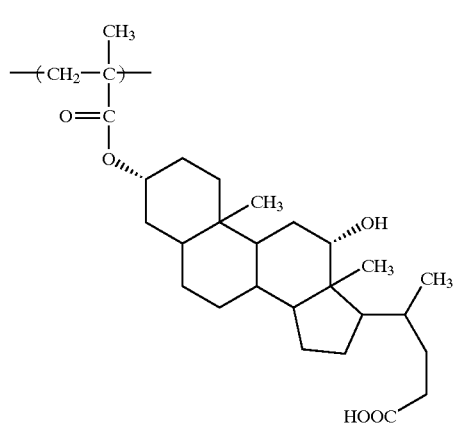
(b28)
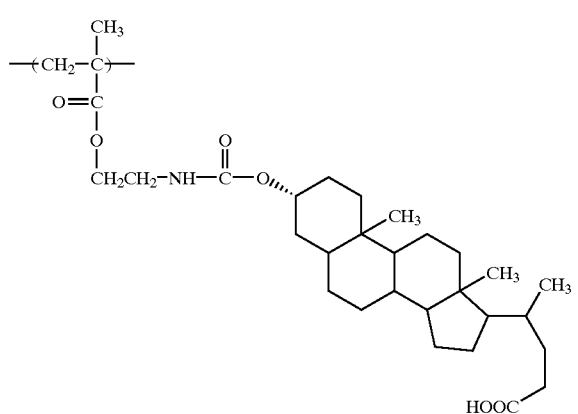
-continued
(b29)
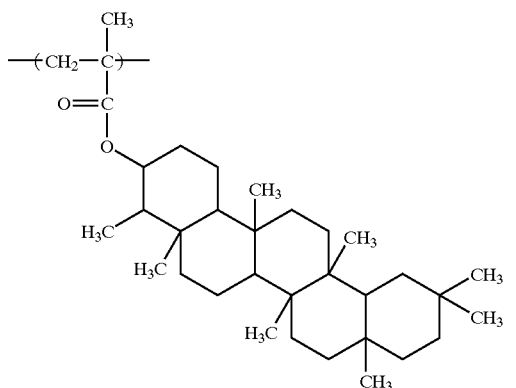
(b30)
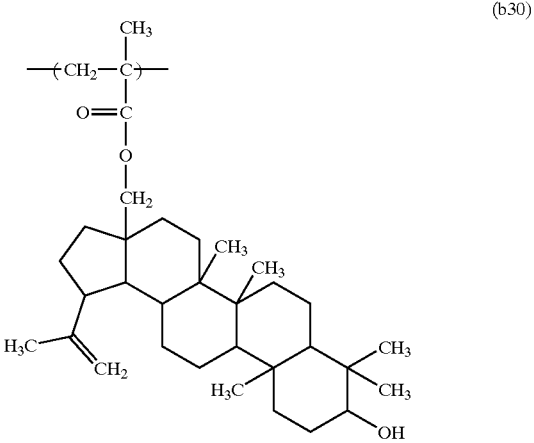
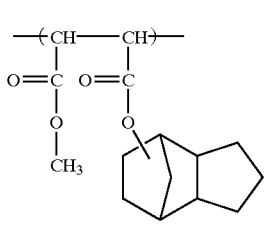
(b31)
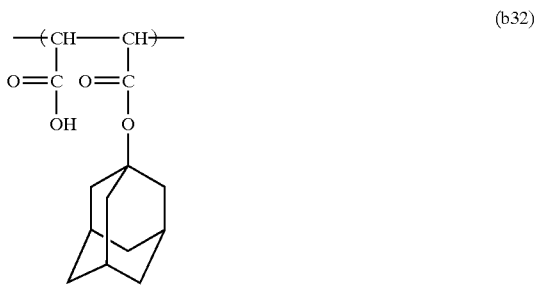
(b32)
(b33)
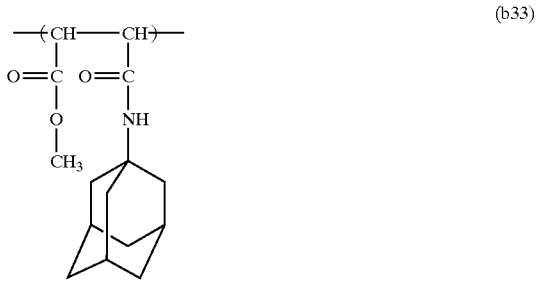

(b34) 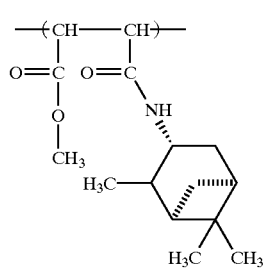
(b35) 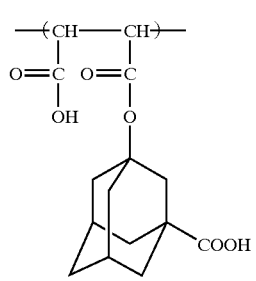
(b36) 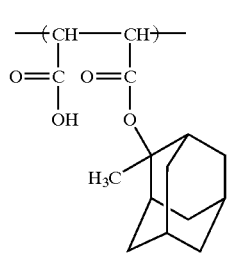
(b37) 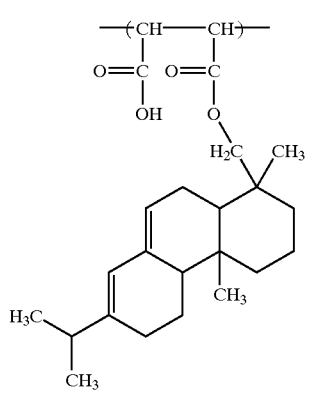
(b38) 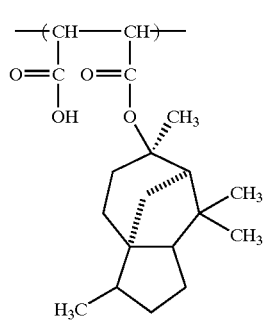
(b39) 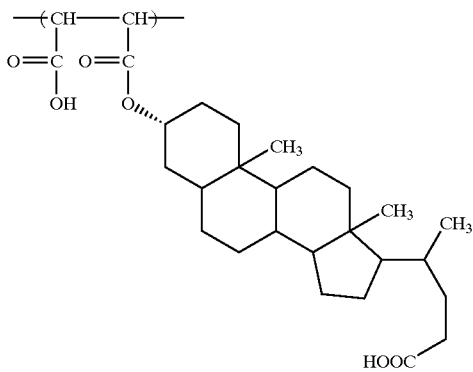
(b40) 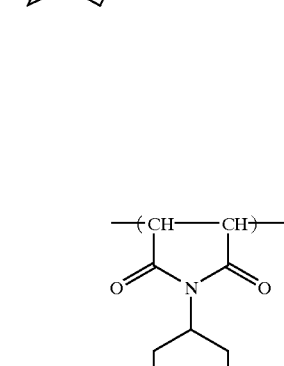
(b41) 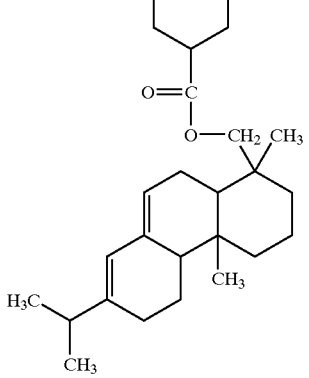

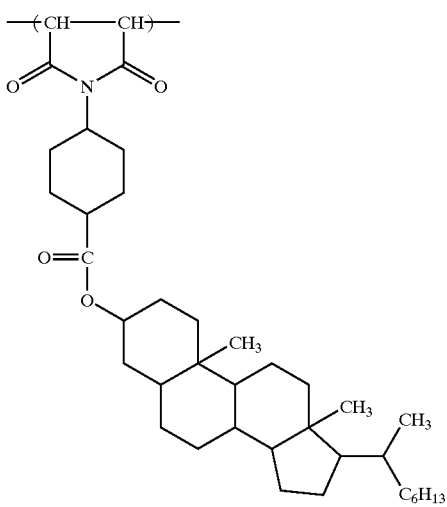
(b42)

[3] Repeating Structural Unit Having Carboxyl Group

In the resin for use in the present invention, the carboxyl group may be contained in the repeating structural unit having an acid decomposable group represented by (I) or (II) (preferably the repeating unit of formula (III), (IV) or (V)), may be contained in the repeating structural unit having a polycyclic-type alicyclic group represented by formula (XII), (XIII) or (XIV), or may be contained in a repeating structural unit other than those described above.

The repeating structural unit having a carboxyl group is preferably a repeating structural unit represented by formula (IX), (X) or (XI).

The alkyl group represented by $R_{17}$, $R_{18}$, $R_{20}$, $R_{21}$ or $R_{22}$ in formulae (IX) to (XI) is preferably an alkyl group having from 1 to 4 carbon atoms, which may have a substituent, such as methyl group, ethyl group, propyl group, n-butyl group or sec-butyl group. The haloalkyl group is preferably an alkyl group having from 1 to 4 carbon atoms, substituted by a fluorine atom, a chlorine atom or a bromine atom, such as fluoromethyl group, chloromethyl group, bromomethyl group, fluoroethyl group, chloroethyl group or bromoethyl group.

The alkyl group represented by $R_{23}$, $R_{24}$, $R_{25}$ or $R_{28}$ is preferably an alkyl group having from 1 to 8 carbon atoms, which may have a substituent, such as methyl group, ethyl group, propyl group, n-butyl group, sec-butyl group, hexyl group, 2-ethylhexyl group or octyl group. The cycloalkyl group is preferably a cycloalkyl group having from 3 to 8 carbon atoms, which may have a substituent, such as cyclopropyl group, cyclopentyl group or cyclohexyl group. The alkenyl group is preferably an alkenyl group having from 2 to 6 carbon atoms, which may have a substituent, such as vinyl group, propenyl group, allyl group, butenyl group, pentenyl group, hexenyl group or cyclohexenyl group.

The alkylene group represented by $X_3$, $X_4$ or $X_5$ is preferably an alkylene group having from 1 to 8 carbon atoms, which may have a substituent, such as methylene group, ethylene group, propylene group, butylene group, hexylene group or octylene group. The alkenylene group is preferably an alkenylene group having from 2 to 6 carbon atoms, which may have a substituent, such as ethenylene group, propenylene group or butenylene group. The cycloalkylene group is preferably a cycloalkylene group having from 5 to 8 carbon atoms, which may have a substituent, such as cyclopentylene group or cyclohexylene group.

The preferred embodiments of the alkylene group, the alkenylene group and the cycloalkylene group represented by $R_{25}$, $R_{26}$, $R_{27}$ or $R_{39}$ are the same as those described above as the preferred embodiments of the alkylene group, the alkenylene group and the cycloalkylene group represented by $X_3$, $X_4$ or $X_5$ and further include divalent groups formed by combining one of those groups with at least one of an ether group, an ester group, an amido group, a urethane group and a ureido group.

Preferred examples of the substituent further for the above-described substituent include a hydroxyl group, a halogen atom (e.g., fluorine, chlorine, bromine, iodine), a nitro group, a cyano group, an amido group, a sulfonamido group, the alkyl groups described for $R_1$, $R_2$, $R_3$, $R_4$ or $R_5$, an alkoxy group such as methoxy group, ethoxy group, hydroxyethoxy group, propoxy group, hydroxypropoxy group and butoxy group, an alkoxycarbonyl group such as methoxycarbonyl group and ethoxycarbonyl group, an acyl group such as formyl group, acetyl group and benzoyl group, an acyloxy group such as acetoxy group and butyryloxy group, and a carboxy group.

The content of the repeating structural unit (preferably the repeating structural unit represented by formula (IX), (X) or (XI)) having the above-described carboxyl group, in the resin for use in the present invention is adjusted depending on the capabilities such as alkali developability, substrate adhesive property and sensitivity, however, it is preferably from 0 to 60 mol %, more preferably from 0 to 40 mol %, still more preferably from 0 to 20 mol %, based on all repeating units. The content of the carboxy group-containing repeating structural unit as used herein means the amount of all carboxyl group-containing repeating structural units in the resin, inclusive of the repeating structural units having a group represented by formula (IX), (X) or (XI) containing a carboxyl group and the acid decomposable group-containing repeating structural units containing a carboxyl group.

The repeating structural unit containing a carboxyl group controls the solubility of the photosensitive composition at the development and contributes for optimizing the sensitivity, pattern profile and resolution.

Specific examples (c1) to (c18) of the repeating structural unit represented by formula (IX), (X) or (XI) are set forth below, however, the present invention is by no means limited thereto.

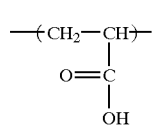
(c1)

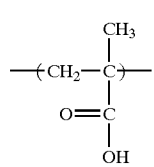
(c2)

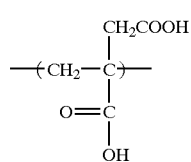
(c3)

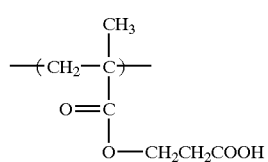 (c4)
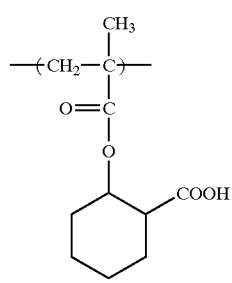 (c5)
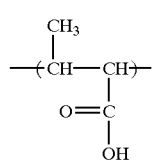 (c6)
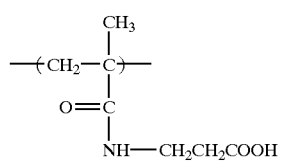 (c7)
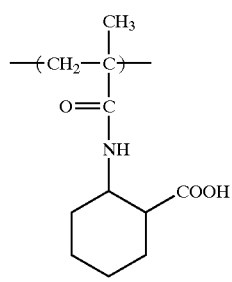 (c8)
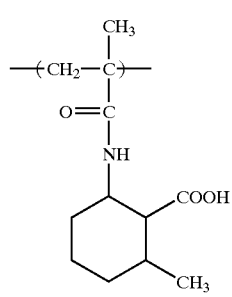 (c9)
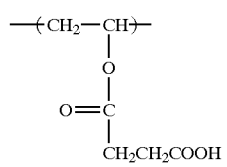 (c10)
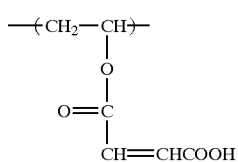 (c11)
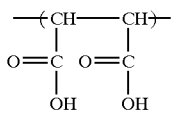 (c12)
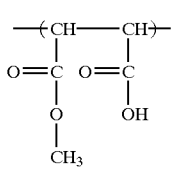 (c13)
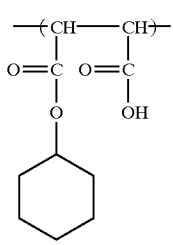 (c14)
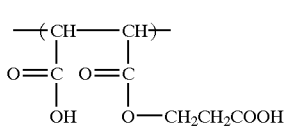 (c15)
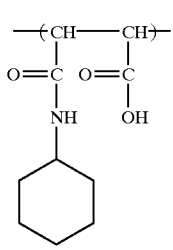 (c16)
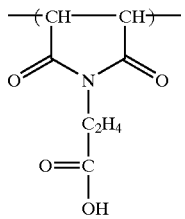 (c17)
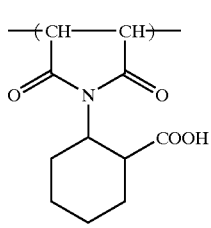 (c18)

[4] Repeating Structural Unit which can be Further Contained in the Resin as Component (B) of the Photosensitive Composition of the Present Invention For the purpose of improving capabilities of the resin as component (B) for use in the present invention, another polymerizable monomer may further be copolymerized within the range of not impairing transmissibility at 220 nm or less and dry etching resistance of the resin.

Examples of the copolymerizable monomer which can be used include compounds having one addition-polymerizable unsaturated bond, such as acrylic acid esters, acrylamides, methacrylic acid esters, methacrylamides, allyl compounds, vinyl ethers, vinyl esters, styrenes and crotonic acid esters.

Specific examples thereof include acrylic acid esters such as alkyl (preferably the alkyl group has from 1 to 10 carbon atoms) acrylate (e.g., methyl acrylate, ethyl acrylate, propyl acrylate, t-butyl acrylate, amyl acrylate, cyclohexyl acrylate, ethylhexyl acrylate, octyl acrylate, t-octyl acrylate, chlroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, tetrahydrofurfuryl acrylate) and aryl acrylate (e.g., phenyl acrylate, hydroxyphenyl acrylate); methacrylic acid esters such as alkyl (preferably the alkyl group has from 1 to 10 carbon atoms) methacrylate (e.g., methyl methacrylate, ethyl methacrylate, propyl methacrylate, isopropyl methacrylate, t-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, timethylolpropane monomethacrylate, pentaerythritol monomethacrylate, glycidyl methacrylate, furfuryl methacrylate, tetrahydrofurfuryl methacrylate) and aryl methacrylate (e.g., phenyl methacrylate, hydroxyphenyl methacrylate, cresyl methacrylate, naphthyl methacrylate); acrylamides such as acrylamide, N-alkylacrylamide (the alkyl group is an alkyl group having from 1 to 10 carbon atoms, such as methyl group, ethyl group, propyl group, butyl group, t-butyl group, heptyl group, octyl group, cyclohexyl group, benzyl group, hydroxyethyl group and benzyl group), N-arylacrylamide (the aryl group is, for example, phenyl group, tolyl group, nitrophenyl group, naphthyl group, cyanophenyl group, hydroxyphenyl group or carboxyphenyl group), N,N-dialkylacrylamide (the alkyl group is an alkyl group having from 1 to 10 carbon atoms, such as methyl group, ethyl group, butyl group, isobutyl group, ethylhexyl group or cyclohexyl group), N,N-arylacrylamide (the aryl group is, for example, phenyl group), N-methyl-N-phenylacrylamide, N-hydroxyethyl-N-methylacrylamide and N-2-acetamidoethyl-N-acetylacrylamide; methacrylamides such as methacrylamide, N-alkylmethacrylamide (the alkyl group is an alkyl group having from 1 to 10 carbon atoms, such as methyl group, ethyl group, t-butyl group, ethylhexyl group, hydroxyethyl group or cyclohexyl group), N-arylmethacrylamide (the aryl group is, for example, phenyl group, hydroxyphenyl group or carboxyphenyl group), N,N-dialkylmethacrylamide (the alkyl group is, for example, ethyl group, propyl group or butyl group), N,N-diarylmethacrylamide (the aryl group is, for example, phenyl group), N-hydroxyethyl-N-methylmethacrylamide, N-methyl-N-phenylmethacrylamide and N-ethyl-N-phenylmethacrylamide; allyl compounds such as allyl esters (e.g., allyl acetate, allyl caproate, allyl caprylate, allyl laurate, allyl palmitate, allyl stearate, allyl benzoate, allyl acetoacetate, allyl lactate) and allyloxyethanol; vinyl ethers such as alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether) and vinyl aryl ether (e.g., vinyl phenyl ether, vinyl tolyl ether, vinyl chlorophenyl ether, vinyl-2,4-dichlorophenyl ether, vinyl naphthyl ether, vinyl anthranyl ether); vinyl esters such as vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxy acetate, vinyl butoxy acetate, vinyl phenyl acetate, vinyl acetoacetate, vinyl lactate, vinyl-β-phenyl butyrate, vinylcyclohexyl carboxylate, vinyl benzoate, vinyl salicylate, vinyl chlorobenzoate, vinyl tetrachlorobenzoate and vinyl naphthoate; styrenes such as styrene, alkylstyrene (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene), alkoxystyrene (e.g., methoxystyrene, 4-methoxy-3-methylstyrene, dimethoxystyrene), halogen styrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene), hydroxystyrene (e.g., 4-hydroxystyrene, 3-hydroxystyrene, 2-hydroxystyrene, 4-hydroxy-3-methylstyrene, 4-hydroxy-3,5-dimethylstyrene, 4-hydroxy-3-methoxystyrene, 4-hydroxy-3-(2-hydroxybenzyl)styrene) and carboxystyrene; crotonic acid esters include alkyl crotonate (e.g., butyl crotonate, hexyl crotonate, glycerin monocrotonate); dialkyl itaconates (e.g., dimethyl itaconate, diethyl itaconate, dibutyl itaconate); dialkyl esters of a maleic acid or fumaric acid (e.g., dimethyl maleate, dibutyl fumarate), maleic anhydride, maleimide, acrylonitrile, methacrylonitrile and maleylonitrile. In addition, addition-polymerizable unsaturated compounds which can be copolymerized in general may be used.

Among these, monomers capable of increasing the alkali solubility are preferred as the copolymer component, for example, monomers having a carboxyl group, such as carboxystyrene, N-(carboxyphenyl)acrylamide and N-(carboxyphenyl)methacrylamide, monomers having a phenolic hydroxyl group, such as hydroxystyrene, N-(hydroxyphenyl)acrylamide, N-(hydroxyphenyl)methacrylamide, hydroxyphenyl acrylate and hydrophenyl methacrylate, and maleimide are preferred.

The content of the other polymerizable monomer in the resin for use in the present invention is preferably 50 mol % or less, more preferably 30 mol % or less, based on all repeating units.

The resin as component (B), (C) or (D) for use in the present invention, containing a repeating structural unit having an acid decomposable group represented by formula (I) and/or (II) (preferably the repeating structural repeating unit represented by formula (III), (IV) or (V) and/or the repeating unit represented by formula (VI), (VII) or (VIII)), a repeating structural unit having a polycyclic-type alicyclic group (preferably the repeating structural unit represented by formula (XII), (XIII) or (XIV)), a repeating structural unit having a carboxyl group, which is added if desired (preferably the repeating structural unit represented by formula (IX), (X) or (XI)), or another polymerizable monomer is synthesized from unsaturated monomers corresponding to respective structures by the radical, cation or anion polymerization.

More specifically, based on the above-described preferred composition, monomers are mixed and polymerized in an appropriate solvent by adding thereto a polymerization catalyst in a monomer concentration of from about 10 to 40 wt %, if desired, under heating.

The resin as component (B), (C) or (D) of the present invention has a molecular weight, in terms of the weight average (Mw: polystyrene basis), of 2,000 or more, preferably from 3,000 to 1,000,000, more preferably from 5,000 to 200,000, still more preferably from 20,000 to 100,000. As the molecular weight is larger, the heat resistance is more improved, however, the developability deteriorates, therefore, a preferred molecular weight is selected taking account of the balance therebetween. The degree of dispersion (Mw/Mn) is preferably from 1.0 to 5.0, more preferably from 1.0 to 3.0. As the degree of dispersion is smaller, the heat resistance and the image performance (pattern profile, defocus latitude, etc.) are improved.

In the present invention, the amount of each resin added in the photosensitive composition is from 50 to 99.7 wt %, preferably from 70 to 99 wt %, based on the total solids content.

[Composition Component (A), Compound Generating Acid by Active Light Ray]

The compound generating an acid on irradiation of an active light ray or radiation as component (A) of the positive photosensitive composition of the present invention, namely, the photo acid generator is described below.

The compound which decomposes on irradiation of an active light ray or radiation and generates an acid, for use in the present invention, may be appropriately selected from photoinitiators for photo-cation polymerization, photoinitiators for photo-radical polymerization, photo-achromatizing agents, photo-discoloring agents, known compounds used in a microresist or the like, which generate an acid by light (ultraviolet ray or far ultraviolet ray of from 200 to 400 nm, particularly preferably, g-line, h-line, i-line, KrF excimer laser beam), an ArF excimer laser beam, an electron beam, an X ray, a molecular beam or an ion beam, and a mixture of these compounds.

Other examples of the compound generating an acid on irradiation of an active light ray or radiation for use in the present invention include diazonium salts described in S. I. Schlesinger, *Photogr. Sci. Eng.*, 18, 387 (1974) and T. S. Bal et al., *Polymer*, 21, 423 (1980), ammonium salts described in U.S. Pat. Nos. 4,069,055, 4,069,056 and Re No. 27,992 and JP-A-3-140140, phosphonium salts described in D. C. Necker et al., *Macromolecules*, 17, 2468 (1984), C. S. Wen et al., *Teh, Proc. Conf. Rad. Curing ASIA*, p. 478, Tokyo, October (1988) and U.S. Pat. Nos. 4,069,055 and 4,069,056, iodonium salts described in J. V. Crivello et al., *Macromolecules*, 10(6), 1307 (1977), *Chem. & Eng. News*, Nov. 28, p. 31 (1988), European Patents 104143, 339049 and 410201, JP-A-2-150848 and JP-A-2-296514, sulfonium salts described in J. V. Crivello et al., *Polymer J.* 17, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., *Polymer Bull.*, 14, 279 (1985), J. V. Crivello et al., *Macromolecules*, 14(5), 1141 (1981), J. V. Crivello et al., *J. Polymer Sci., Polymer Chem. Ed.*, 17, 2877 (1979), European Patents 161811, 410201, 339049, 370693, 233567, 297443 and 297442, U.S. Pat. Nos. 3,902,114, 4,933,377, 4,760,013, 4,734,444 and 2,833,827, German Patents 2,904,626, 3,604,580 and 3,604,581, JP-A-7-28237 and JP-A-8-27102, selenium salts described in J. V. Crivello et al., *Macromolecules*, 10(6), 1307 (1977), and J. V. Crivello et al., *J. Polymer Sci., Polymer Chem. Ed.*, 17, 1047 (1979), onium salts such as arsonium salt described in C. S. Wen et al., *Teh, Proc. Conf. Rad. Curing ASIA*, p. 478, Tokyo, October (1988), organic halogen compounds described in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339, organic metals/organic halides described in K. Meier et al., *J. Rad. Curing*, 13(4), 26 (1986), T. P. Gill et al., *Inorg. Chem.*, 19, 3007 (1980), D. Astruc, *Acc. Chem. Res.*, 19(12), 377 (1896) and JP-A-2-161445, photo acid generators having an o-nitrobenzyl type protective group, described in S. Hayase et al., *J. Polymer Sci.*, 25, 753 (1987), E. Reichmanis et al., *J. Polymer Sci., Polymer Chem. Ed.*, 23, 1 (1985), Q. Q. Zhu et al., *J. Photochem.*, 36, 85, 39, 317 (1987), B. Amit et al., *Tetrahedron Lett.*, (24)2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11(4), 191 (1985), H. M. Houlihan et al., *Macromolecules*, 21, 2001 (1988), P. M. Collins et al., *J. Chem. Soc., Chem. Commun.*, 532 (1972), S. Hayase et al., *Macromolecules*, 18, 1799 (1985), E. Reichmanis et al., *J. Electrochem. Soc., Solid State Sci. Technol.*, 130(6), F. M. Houlihan et al., *Macromolecules*, 21, 2001 (1988), European Patents 0290750, 046083, 156535, 271851 and 0388343, U.S. Pat. Nos. 3,901,710 and 4,181,531, JP-A-60-198538 and JP-A-53-133022, compounds which photolyze and generate a sulfonic acid, represented by iminosulfonate and the like and described in M. TUNOOKA et al., *Polymer Preprints Japan*, 35(8), G. Berner et al., *J. Rad. Curing*, 13(4), W. J. Mijs et al., *Coating Technol.*, 55(697), 45 (1983), Akzo, H. Adachi et al., *Polymer Preprints, Japan*, 37(3), European Patents 0199672, 84515, 044115, 618564 and 0101122, U.S. Pat. Nos. 4,371,605 and 4,431,774, JP-A-64-18143, JP-A-2-245756 and JP-A-3-140109, disulfone compounds described in JP-A-61-166544 and JP-A-2-71270, and diazoketosulfone and diazodisulfone compounds described in JP-A-3-103854, JP-A-3-103856 and JP-A-4-210960.

Furthermore, compounds having introduced into the main or side chain of the polymer the group or compound generating an acid by light may also be used and examples thereof include compounds described in M. E. Woodhouse et al., *J. Am. Chem. Soc.*, 104, 5586 (1982), S. P. Pappas et al., *J. Imaging Sci.*, 30(5), 218 (1986), S. Kondo et al., *Makromol. Chem., Rapid Commun.*, 9, 625 (1988), Y. Yamada et al., *Makromol. Chem.*, 152, 153, 163 (1972), J. V. Crivello et al., *J. Polymer Sci., Polymer Chem. Ed.*, 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029.

Also, compounds which generate an acid by light described in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and European Patent 126712 may be used.

Among the above-described compounds which decompose on irradiation of an active light ray or radiation and generate an acid, those which can be particularly effectively used are described below.

(1) Oxazole Derivative represented by Formula (PAG1) or S-Triazine Derivative represented by Formula (PAG2), substituted by Trihalomethyl Group

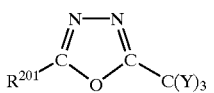
(PAG1)

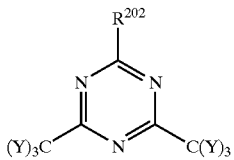
(PAG2)

wherein $R^{201}$ represents a substituted or unsubstituted aryl group or alkenyl group, $R^{202}$ represents a substituted or unsubstituted aryl group, alkenyl group or alkyl group or —C(Y)$_3$, and Y represents a chlorine atom or a bromine atom.

Specific examples thereof include the following compounds, however, the present invention is by no means limited thereto.

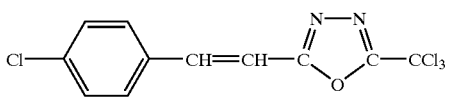
(PAG1-1)

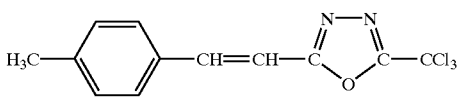
(PAG1-2)

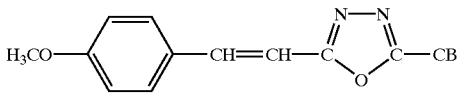
(PAG1-3)

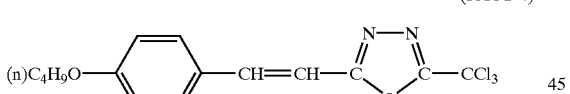
(PAG1-4)

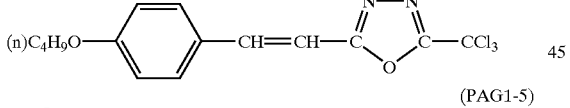
(PAG1-5)

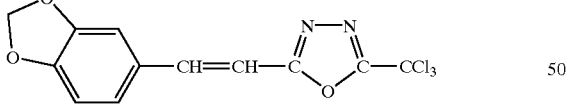
(PAG1-6)

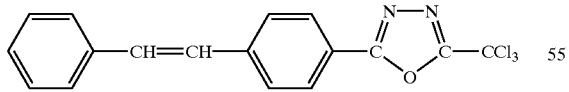
(PAG1-7)

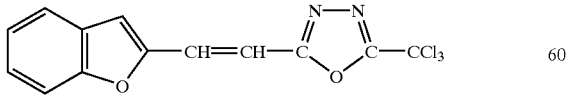
(PAG1-8)

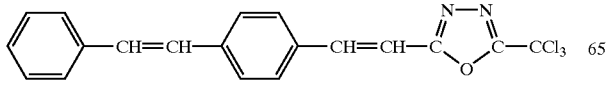

-continued

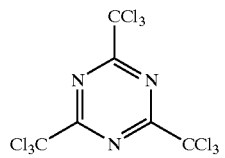
(PAG2-1)

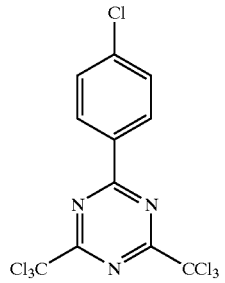
(PAG2-2)

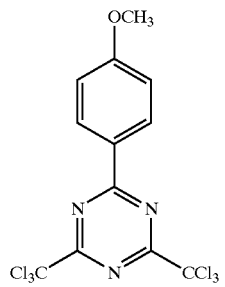
(PAG2-3)

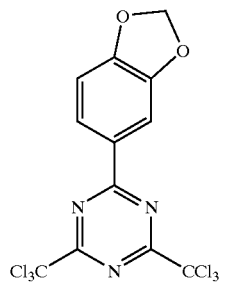
(PAG2-4)

(PAG2-5)

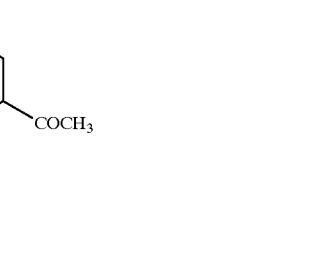
(PAG2-6)

(PAG2-7)

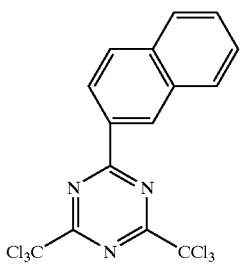

(PAG2-8)

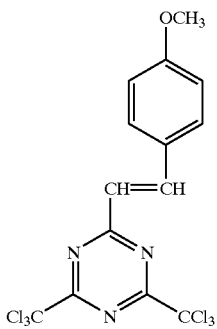

(PAG2-9)

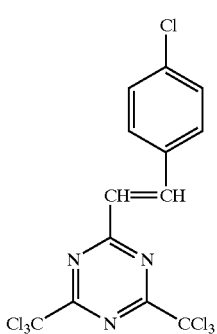

(PAG2-10)

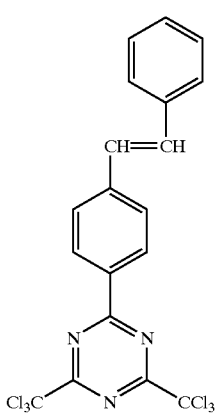

(2) Iodonium Salt represented by Formula (PAG3) or Sulfonium Salt represented by Formula (PAG4)

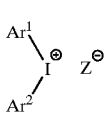

(PAG3)

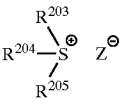

(PAG4)

In the formulae, $Ar^1$ and $Ar^2$ each independently represents a substituted or unsubstituted aryl group. Preferred examples of the substituent include an alkyl group, a haloalkyl group, a cycloalkyl group, an aryl group, an alkoxy group, a nitro group, a carboxyl group, an alkoxycarbonyl group, a hydroxy group, a mercapto group and a halogen atom.

$R^{203}$, $R^{204}$ and $R^{205}$ each independently represents a substituted or unsubstituted alkyl group or aryl group, preferably an aryl group having from 6 to 14 carbon atoms, an alkyl group having from 1 to 8 carbon atoms, or a substituted derivative thereof. Preferred examples of the substituent include, for the aryl group, an alkoxy group having from 1 to 8 carbon atoms, an alkyl group having from 1 to 8 carbon atoms, a nitro group, a carboxyl group, a hydroxyl group and a halogen atom, and for the alkyl group, an alkoxy group having from 1 to 8 carbon atoms, a carboxyl group and an alkoxycarbonyl group.

Examples of the counter anion represented by $Z^-$ include perfluoroalkane sulfonate anions such as $BF_4^-$, $AsF_6^-$, $PF_6^-$, $SbF_6^-$, $SiF_6^{2-}$, $ClO_4^-$ and $CF_3SO_3^-$, pentafluorobenzene sulfonate anions, condensed polynuclear aromatic sulfonate anions such as naphthalene-1-sulfonate anion, anthraquinone sulfonate anion, and sulfonic acid group-containing dyes, however, the present invention is by no means limited thereto.

Two of $R^{203}$, $R^{204}$ and $R^{205}$ or $Ar^1$ and $Ar^2$ may be combined through a single bond or a substituent.

Specific examples include the following compounds, however, the present invention is not limited thereto by any means.

(PAG3-1)

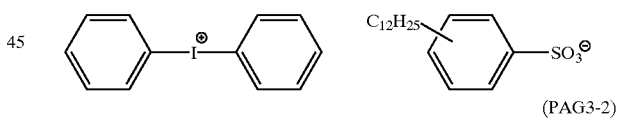

(PAG3-2)

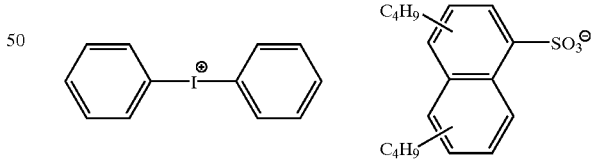

(PAG3-3)

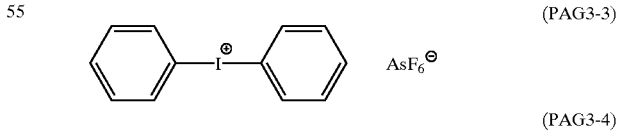 AsF$_6^\ominus$ (PAG3-4)

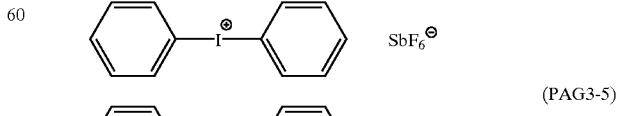 SbF$_6^\ominus$ (PAG3-5)

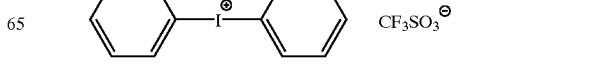 CF$_3$SO$_3^\ominus$

-continued
(PAG3-6)
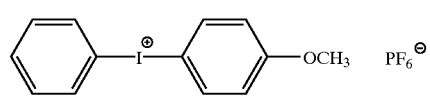
(PAG3-7)
(PAG3-8)
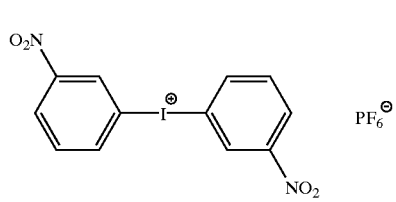
(PAG3-9)
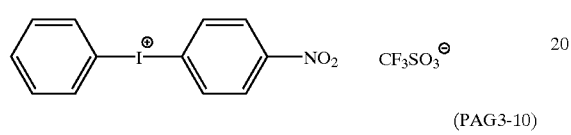
(PAG3-10)
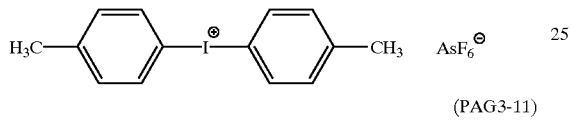
(PAG3-11)
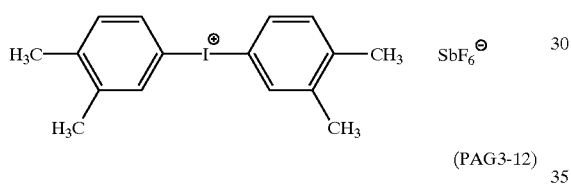
(PAG3-12)
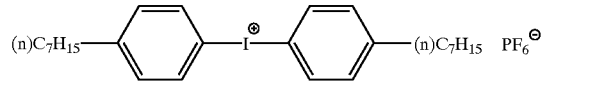
(PAG3-13)
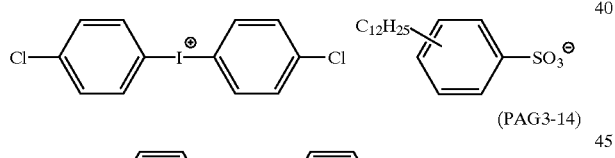
(PAG3-14)
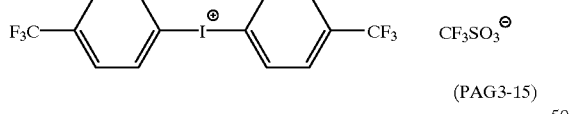
(PAG3-15)
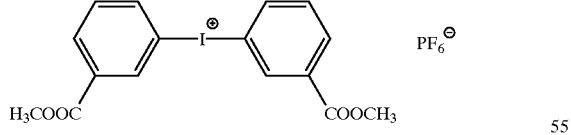
(PAG3-16)
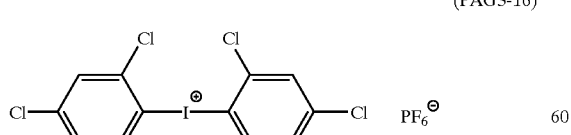
(PAG3-17)
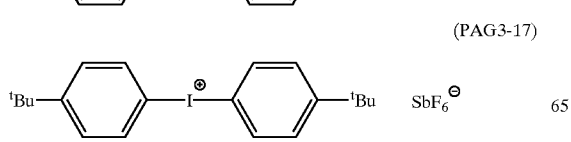
-continued
(PAG3-18)
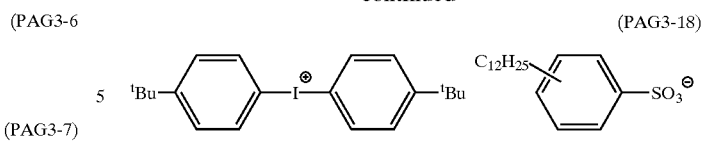
(PAG3-19)
(PAG3-20)
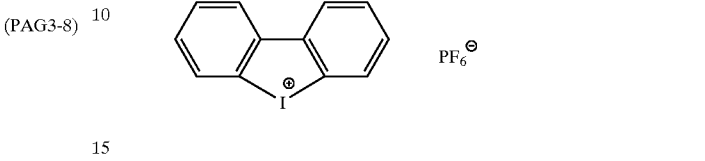
(PAG3-21)
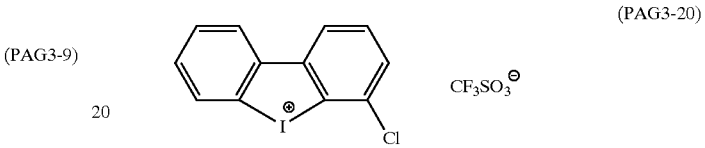
(PAG3-22)
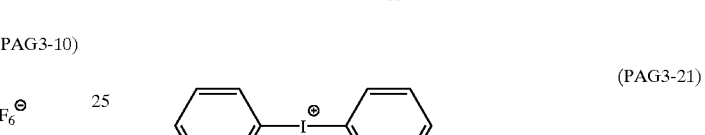
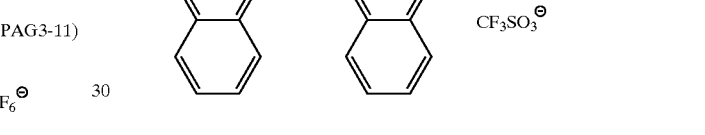
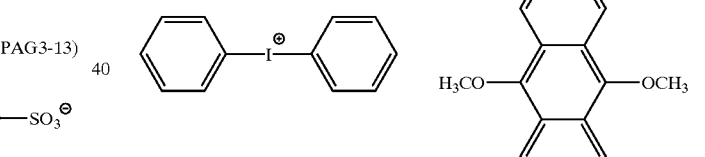
(PAG3-23)
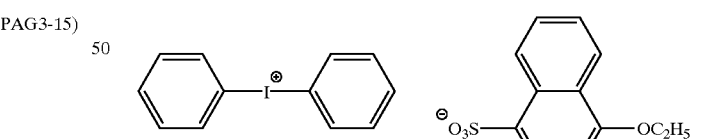
(PAG3-24)
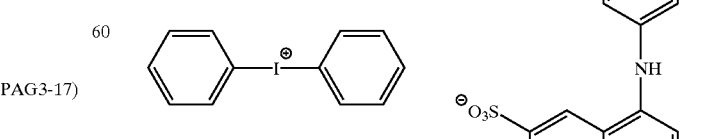

-continued
(PAG3-25)
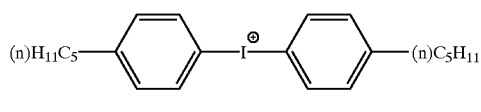
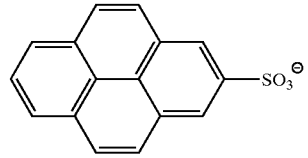
(PAG3-26)
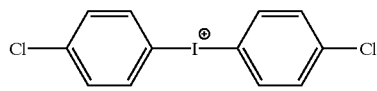
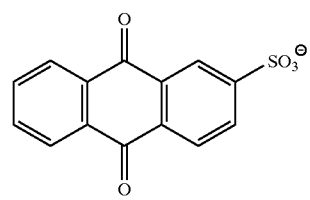
(PAG3-27)
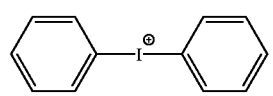
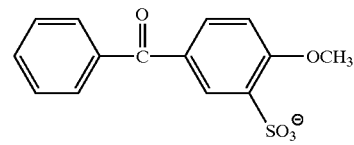
(PAG4-1)
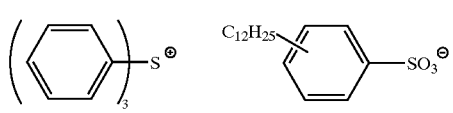
(PAG4-2)
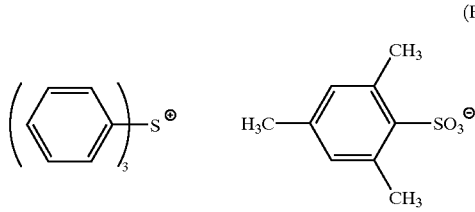
(PAG4-3)
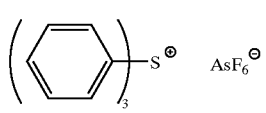 AsF$_6^\ominus$
(PAG4-4)
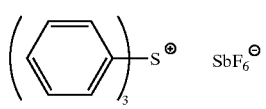 SbF$_6^\ominus$
(PAG4-5)
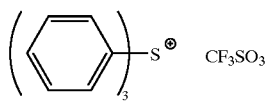 CF$_3$SO$_3^\ominus$
(PAG4-6)
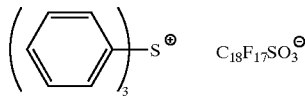 C$_{18}$F$_{17}$SO$_3^\ominus$
-continued
(PAG4-7)
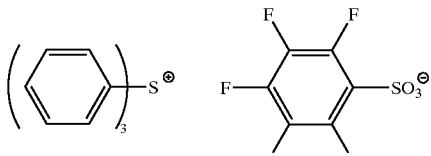
(PAG4-8)
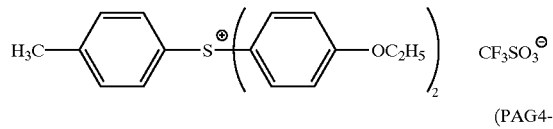
(PAG4-9)
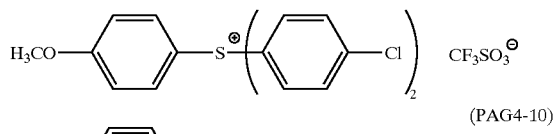
(PAG4-10)
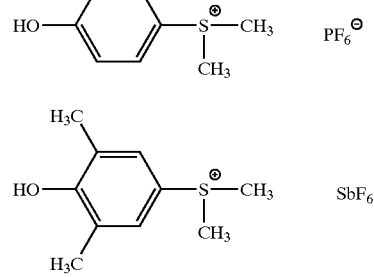
(PAG4-11)
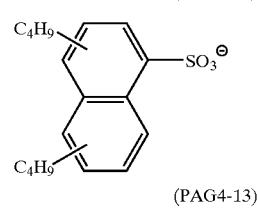
(PAG4-12)
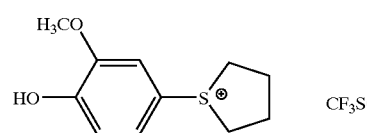
(PAG4-13)
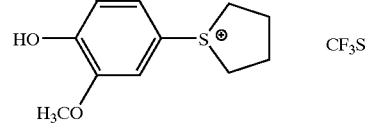
(PAG4-14)
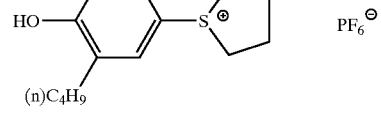
(PAG4-15)
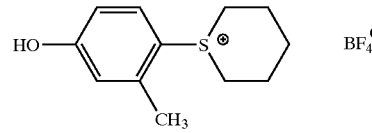
(PAG4-16)
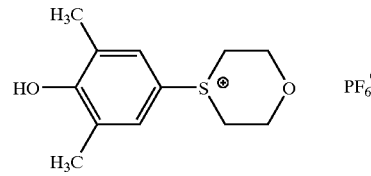

-continued
(PAG4-17)
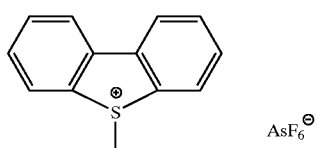
(PAG4-18)
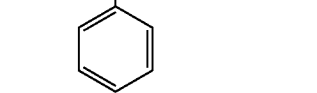
(PAG4-19)
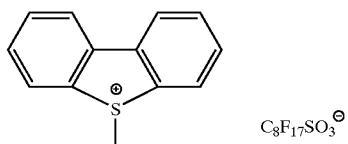
(PAG4-20)
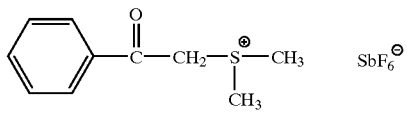
(PAG4-21)
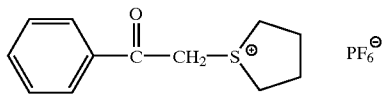
(PAG4-22)
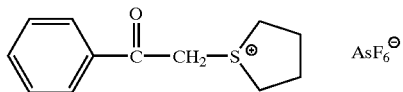
(PAG4-23)
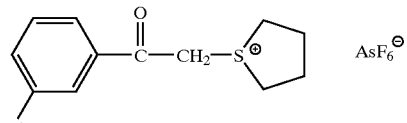
(PAG4-24)
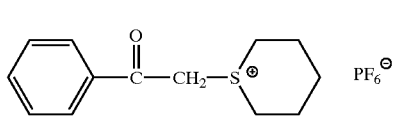
(PAG4-25)
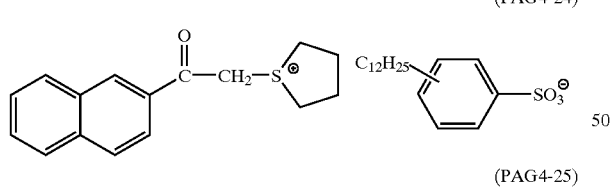
(PAG4-26)
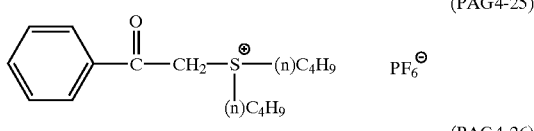
(PAG4-27)
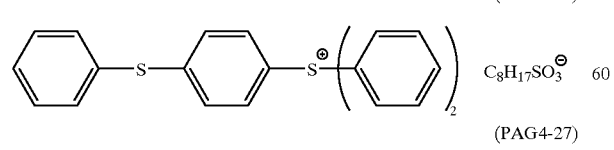
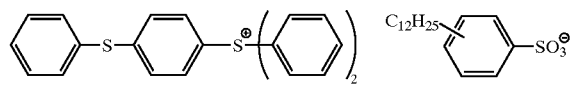
-continued
(PAG4-28)
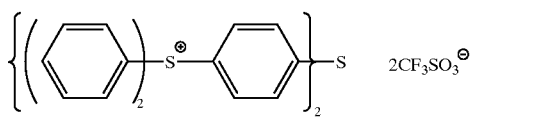
(PAG4-29)
(PAG4-30)
(PAG4-31)
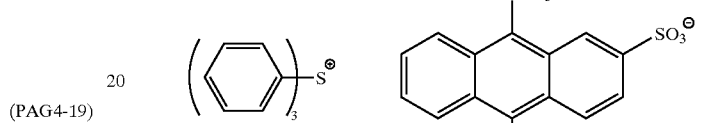
(PAG4-32)
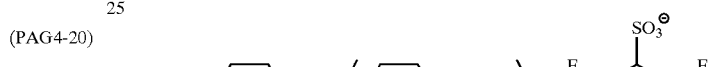
(PAG4-33)
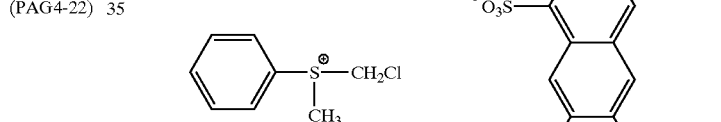
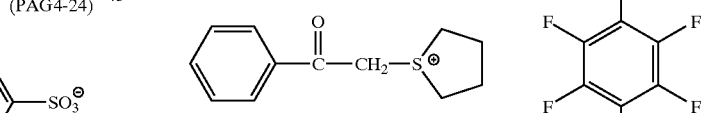
(PAG4-34)
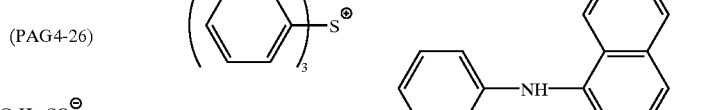
The onium salts represented by formulae (PAG3) and (PAG4) are known and can be synthesized by the method described, for example, in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.,* 18, 2677 (1980), U.S. Pat. Nos. 2,807,648 and 4,247,473, and JP-A-53-101331.

(3) Disulfone Derivative represented by Formula (PAG5) or Iminosulfonate Derivative represented by Formula (PAG6)

$$Ar^3-SO_2-SO_2-Ar^4 \quad \text{(PAG5)}$$

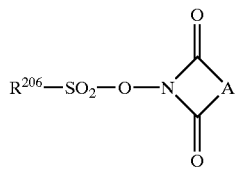

(PAG6)

wherein $Ar^3$ and $Ar^4$ each independently represents a substituted or unsubstituted aryl group, $R^{206}$ represents a substituted or unsubstituted alkyl group or aryl group, and A represents a substituted or unsubstituted alkylene group, alkenylene group or arylene group.

Specific examples thereof include the following compounds, however, the present invention is by no means limited thereto.

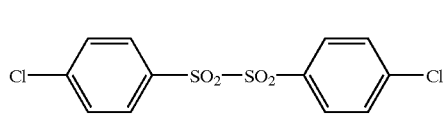
(PAG5-1)

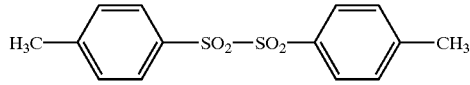
(PAG5-2)

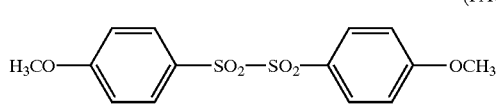
(PAG5-3)

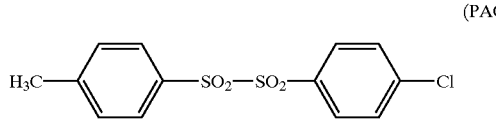
(PAG5-4)

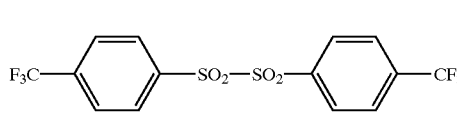
(PAG5-5)

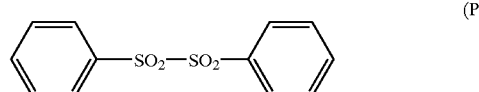
(PAG5-6)

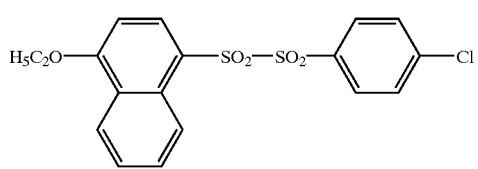
(PAG5-7)

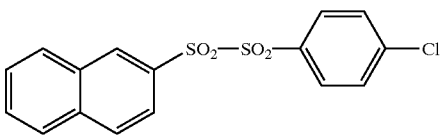
(PAG5-8)

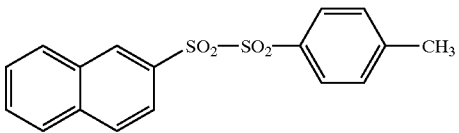
(PAG5-9)

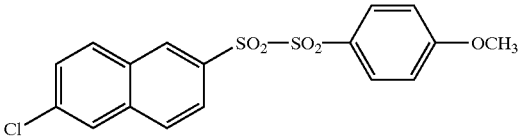
(PAG5-10)

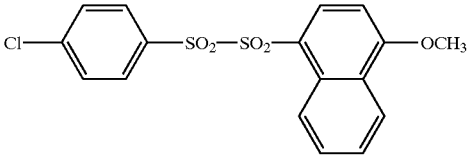
(PAG5-11)

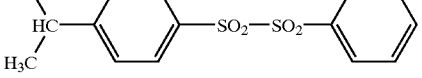
(PAG5-12)

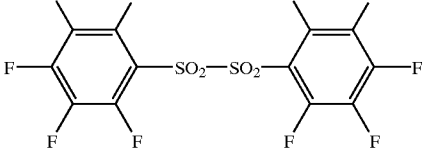
(PAG5-13)

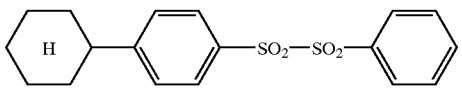
(PAG5-14)

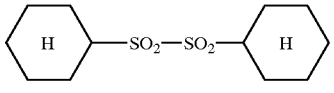
(PAG5-15)

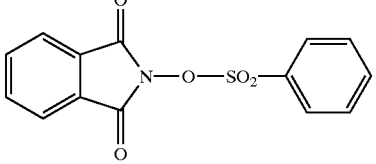
(PAG6-1)

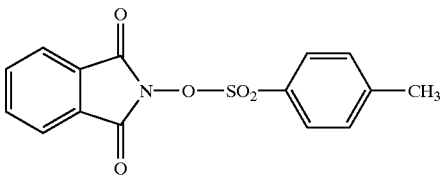
(PAG6-2)

(PAG6-3)
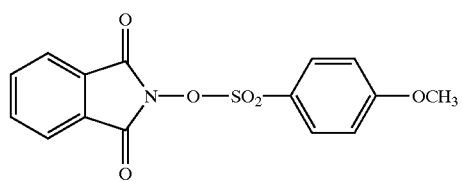
(PAG6-11)
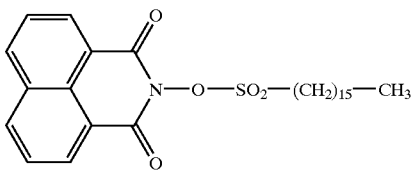
(PAG6-4)
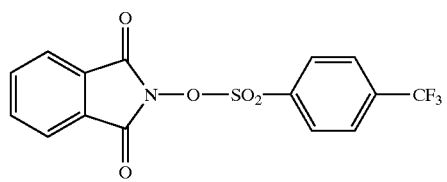
(PAG6-12)
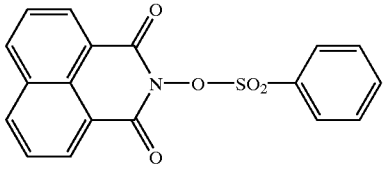
(PAG6-5)
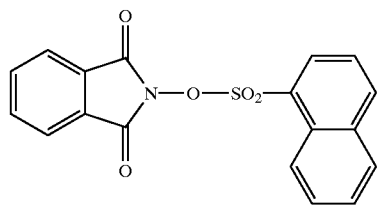
(PAG6-13)
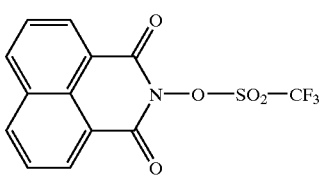
(PAG6-6)
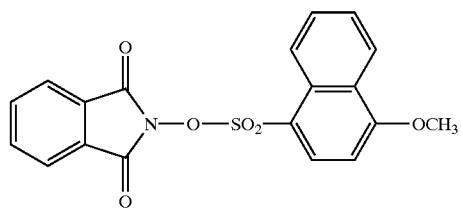
(PAG6-14)
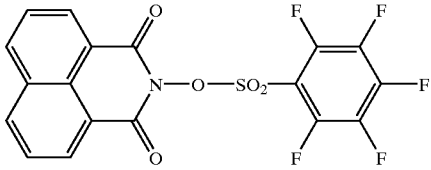
(PAG6-7)
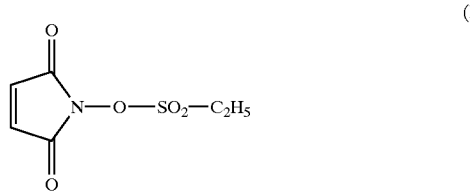
(PAG6-15)
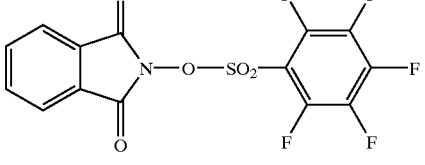
(PAG6-8)
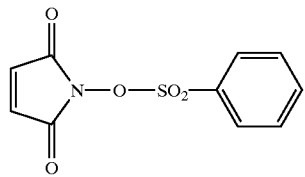
(PAG6-16)
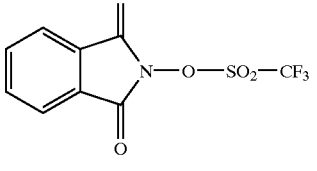
(PAG6-9)
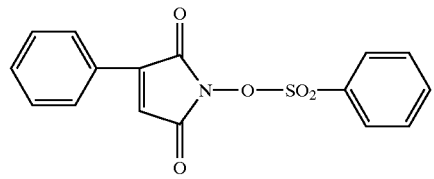
(PAG6-17)
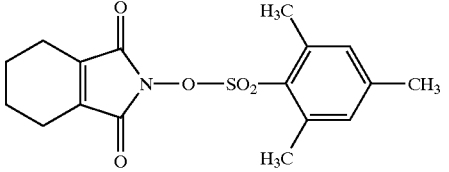
(PAG6-10)
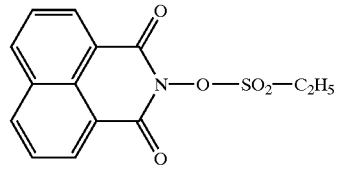
(PAG6-18)
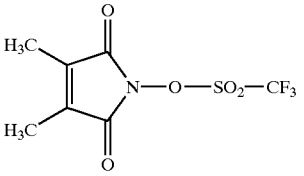

-continued (PAG6-19)

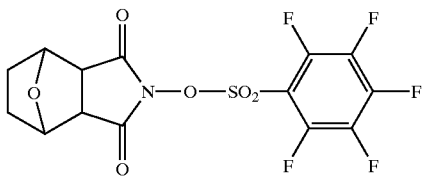

The added amount of the compound which decomposes on irradiation of an active light ray or radiation and generates an acid is usually from 0.001 to 40 wt %, preferably from 0.01 to 20 wt %, more preferably from 0.1 to 5 wt %, based on the entire weight of the photosensitive composition (excluding the coating solvent). If the added amount of the compound which decomposes on irradiation of an active light ray or radiation and generates an acid is less than 0.001 wt %, the sensitivity is reduced, whereas if the added amount exceeds 40 wt %, the resist exhibits too high light absorption and this causes disadvantageous effects such as bad profile or narrow process (particularly bake) margin.

[5] Other Components for Use in the Present Invention

The positive photosensitive composition of the present invention may further contain, if desired, an acid decomposable dissolution inhibiting compound, a dye, a plasticizer, a surface active agent, a photosensitizer, an organic basic compound, a compound which accelerates the solubility in a developer, and the like.

The acid decomposable dissolution inhibiting compound for use in the present invention is a low molecular weight compound containing at least one acid decomposable group represented by formula (XIII) or (XIV) and having a molecular weight of 3,000 or less. In order to prevent reduction in the transmissibility particularly at 220 nm or less, an alicyclic or aliphatic compound such as cholic acid derivatives described in *Proceeding of SPIE*, 2724, 355 (1996) is preferred. In the present invention, when the acid decomposable dissolution inhibiting compound is used, the added amount thereof is from 3 to 50 wt %, preferably from 5 to 40 wt %, more preferably from 10 to 35 wt %, based on the entire weight of the photosensitive composition (excluding the solvent).

The compound for accelerating the dissolution in a developer, which can be used in the present invention, is a low molecular weight compound containing two or more phenolic OH groups or one or more carboxyl group and having a molecular weight of 1,000 or less. In the case where the compound contains a carboxyl group, an alicyclic or aliphatic compound is preferred from the same reason as described above.

The amount of the dissolution accelerating compound added is preferably from 2 to 50 wt %, more preferably from 5 to 30 wt %, based on the resin for use in the present invention. If the added amount exceeds 50 wt %, the development residue acts adversely or a new problem disadvantageously arises that the pattern deforms at the development.

The above-described phenol compound having a molecular weight of 1,000 or less can be easily synthesized by one skilled in the art by referring to the method described, for example, in JP-A-4-122938, JP-A-2-28531, U.S. Pat. No. 4,916,210 and European Patent 219294.

Specific examples of the phenol compound are described below, however, the compounds which can be used in the present invention are not limited thereto by any means.

Resorcinol, phloroglucinol, 2,3,4-trihydroxybenzophenone, 2,3,4,4'-tetrahydroxybenzophenone, 2,3,4,3',4',5'-hexahydroxybenzophenone, acetone-pyrogallol condensed resin, phloroglucocide, 2,4,2',4'-biphenyltetrol, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenylsulfone, tris(4-hydroxyphenyl)methane, 1,1-bis(4-hydroxyphenyl)cyclohexane, 4,4-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl)hexane, 1,2-tetrakis(4-hydroxyphenyl)ethane, 1,1,3-tris(hydroxyphenyl)butane and para[α,α,α',α'-tetrakis(4-hydroxyphenyl)]xylene.

The organic basic compound which can be used in the present invention is preferably a compound having basicity stronger than the phenol, more preferably a nitrogen-containing basic compound.

The preferred chemical environment thereof includes the following structures (A) to (E).

(A)

wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbons atoms, and $R^{251}$ and $R^{252}$ may combine with each other to form a ring;

(B)

(C)

(D)

(E)

wherein $R^{253}$, $R^{254}$, $R^{255}$ and $R^{256}$, which may be the same or different, each represents an alkyl group having from 1 to 6 carbon atoms.

More preferred is a nitrogen-containing basic compound containing two or more nitrogen atoms of different chemical environments in one molecule, still more preferred is a compound containing both a ring structure having a substituted or unsubstituted amino group and a ring structure having a nitrogen atom, or a compound having an alkylamino group. Preferred specific examples thereof include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine and a substituted or unsubstituted aminoalkylmorpholine. The substituent is preferably an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group or a cyano group. More preferred examples of the compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperizine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine, however, the present invention is by no means limited thereto.

These nitrogen-containing basic compounds are used individually or in combination of two or more thereof. The amount of the nitrogen-containing basic compound used is usually from 0.001 to 10 parts by weight, preferably from 0.01 to 5 parts by weight, per 100 parts by weight of the photosensitive resin composition (excluding the solvent). If the amount used is less than 0.001 part by weight, the effect owing to the addition of the nitrogen-containing basic compound cannot be obtained, whereas if it exceeds 10 parts by weight, reduction in the sensitivity or deterioration in the developability of the unexposed area is liable to occur.

Suitable dyes include an oily dye and a basic dye. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all are produced by Orient Chemical Industries Co., Ltd.), Crystal Violet (CI42555), Methyl Violet (CI42535), Rhodamine B (CI45170B), Malachite Green (CI42000) and Methylene Blue (CI52015).

In order to improve acid generation ratio on exposure, a photosensitizer may be added. Specific examples of suitable photosensitizers include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzyl, Acridine Orange, benzoflavin, Setoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin) and coronene, however, the present invention is by no means limited thereto.

These photosensitizers may also be used as a light absorbent of far ultraviolet light from the light source. In this case, the light absorbent reduces the reflected light from the substrate and decreases the influence of multiple reflection within the resist layer, thereby exerting the effect of improving the standing wave.

The photosensitive composition of the present invention is dissolved in a solvent which can dissolve the above-described respective components, and then coated on a support. The solvent used here is preferably ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone or tetrahydrofuran. These solvents are used individually or in combination.

To this solvent, a surface active agent may be added. Specific examples thereof include a nonionic surface active agent, for example, polyoxyethylene alkyl ethers such as polyoxyethylene lauryl ether, polyoxyethylene stearyl ether, polyoxyethylene cetyl ether and polyoxyethylene oleyl ether, polyoxyethylene alkylaryl ethers such as polyoxyethylene octylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; a fluorine-base surface active agent such as Eftop EF301, EF303, EF352 (all produced by Shin-Akita Kasei KK), Megafac F171, F173 (both produced by Dainippon Ink & Chemicals, Inc.), Florad FC430, FC431 (both produced by Sumitomo 3M Limited), Asahiguard AG710, Surflon S-382, SC101, SC102, SC103, SC104, SC105 and SC-106 (all produced by Asahi Glass Co., Ltd.); and Organosiloxane Polymer KP-341 (produced by Shin-Etsu Chemical Co., Ltd.), and acrylic acid-base or methacrylic acid-base (co)polymer Polyflow No. 75 and No. 95 (both produced by Kyoeisha Yushi Kagaku Kogyo KK). The amount of the surface active agent mixed is usually 2 parts by weight or less, preferably 1 part by weight or less, per 100 parts by weight of the solids content in the composition of the present invention.

These surface active agents may be used individually or some may be added in combination.

The above-described photosensitive composition is coated on a substrate (e.g., silicon/silicon dioxide coating) for use in the production of a precision integrated circuit element by an appropriate coating method such as spinner or coater, exposed through a predetermined mask, baked and developed to thereby obtain a good resist pattern. The exposure light is preferably a far ultraviolet beam having a wavelength of 250 nm or less, more preferably 220 nm or less. Specific examples thereof include KrF excimer laser (248 nm), ArF excimer laser (193 m), $F_2$ excimer laser (157 nm), X ray and electron beam.

The developer which can be used for the photosensitive composition of the present invention is an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, and cyclic amines such as pyrrole and piperidine.

To the alkaline aqueous solution, an appropriate amount of an alcohol or surface active agent may be added.

The present invention is described in greater detail below, however, the present invention should not be construed as being limited thereto.

SYNTHESIS EXAMPLE 1
Synthesis of Material Monomer as Structure (a3)

14.0 g (0.10 mol) of acrylic anhydride and 8.8 g (0.10 mol) of 2-hydroxy-2-methylbutane were dissolved in 200 ml of THF. To the resulting solution, a DMF 50 ml solution containing 12.3 g (0.10 mol) of N,N-dimethylaminopyridine was added at room temperature while stirring. While further stirring, the mixed solution was refluxed under heating for 5 hours. The solution was allowed to cool and then the reaction solution was poured into 3 L of ion exchanged water while vigorously stirring and extracted with 300 ml of ethyl acetate. The ethyl acetate solution was washed with water, dried over magnesium sulfate and then concentrated under reduced pressure. The resulting concentrate was purified by distillation under reduced pressure and 10.7 g of a colorless liquid was obtained. This liquid was verified by NMR to be the material monomer as Structure (a3) of the present invention.

SYNTHESIS EXAMPLE 2
Synthesis of Material Monomer as Structure (a5)

15.4 g (0.10 mol) of methacrylic anhydride and 8.6 g (0.10 mol) of 3-hydroxy-3-methylbutenol were dissolved in 200 ml of THF. To the resulting solution, a DMF 50 ml solution containing 12.3 g (0.10 mol) of N,N-dimethylaminopyridine was added at room temperature while stirring. While further stirring, the mixed solution was refluxed under heating for 5 hours. The solution was allowed. to cool and then the reaction solution was poured into 3 L of ion exchanged water while vigorously stirring and extracted with 300 ml of ethyl acetate. The ethyl acetate solution was washed with water, dried over magnesium sulfate and then concentrated under reduced pressure. The resulting concentrate was purified by distillation under reduced pressure and 11.4 g of a colorless liquid was obtained. This liquid was verified by NMR to be the material monomer as Structure (a5) of the present invention.

SYNTHESIS EXAMPLE 3
Synthesis of Material Monomer as Structure (a18)

17.2 g (0.20 mol) of methacrylic acid and 25.2 g (0.30 mol) of dihydropyrane were dissolved in 200 ml of THF. To the resulting solution, 0.1 g of 2-ethylhexylphosphoric acid ester as a catalyst was added and the mixed solution was heated at 50° C. for 8 hours while stirring. After neutralizing the catalyst with triethylamine, the solution was purified by distillation under reduced pressure and 26.5 g of a colorless liquid was obtained. This liquid was verified by NMR to be the material monomer as Structure (a18) of the present invention.

SYNTHESIS EXAMPLE 4
Synthesis of Material Monomer as Structure (a21)

24.5 g of a colorless liquid was obtained in the same manner as in Synthesis Example 3 except for using 21.6 g (0.30 mol) of ethyl vinyl ether in place of dihydropyrane in Synthesis Example 3. The liquid obtained was verified by NMR to be the material monomer as Structure (a21) of the present invention.

SYNTHESIS EXAMPLE 5
Synthesis of Material Monomer as Structure (a23)

17.2 g (0.20 mol) of methacrylic acid and 24.9 g (0.20 mol) of 2-methoxyethoxymethyl chloride were dissolved in 200 ml of DMAc. To the resulting solution, 20.3 g of triethylamine was added and the mixed solution was heated at 90° C. for 7 hours while stirring. The solution was allowed to cool and then the reaction solution was poured into 3 L of ion exchanged water while vigorously stirring and extracted with 300 ml of ethyl acetate. The ethyl acetate solution was washed with water, dried over magnesium sulfate and then concentrated under reduced pressure. The resulting concentrate was purified by column chromatography (filler: silica gel, eluent: hexane/ethyl acetate=3/1) and 13.4 g of a colorless liquid was obtained. This liquid was verified by NMR to be the material monomer as Structure (a23) of the present invention.

SYNTHESIS EXAMPLE 6
Synthesis of Material Monomer as Structure (b13)

15.4 g (0.10 mol) of methacrylic anhydride and 14.0 g (0.10 mol) of Compound (i) shown below (9-hydroxy-bicyclo-[3.3.1]nonane) were dissolved in 200 ml of THF. To the resulting solution, a DMF 50 ml solution containing 12.3 g (0.10 mol) of N,N-dimethylaminopyridine was added at room temperature while stirring. While further stirring, the mixed solution was refluxed under heating for 5 hours. The solution was allowed to cool and then the reaction solution was poured into 3 L of ion exchanged water while vigorously stirring and extracted with 300 ml of ethyl acetate. The ethyl acetate solution was washed with water, dried over magnesium sulfate and then concentrated under reduced pressure. The resulting concentrate was purified by column chromatography (filler: silica gel, eluent: hexane/ethyl acetate=4/1) and 12.8 g of a colorless liquid was obtained. This liquid was verified by NMR to be the material monomer as Structure (b13) of the present invention.

Compound (i)

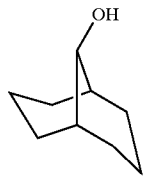

SYNTHESIS EXAMPLE 7
Synthesis of Material Monomer as Structure (b23)

15.4 g (0.10 mol) of methacrylic anhydride and 28.5 g (0.10 mol) of Compound (ii) shown below were dissolved in 200 ml of tetrahydrofurane (THF). To the resulting solution, a DMF 50 ml solution containing 12.3 g (0.10 mol) of N,N-dimethylaminopyridine was added at room temperature while stirring. While further stirring, the mixed solution was refluxed under heating for 5 hours. The solution was allowed to cool and then the reaction solution was poured into 3 L of ion exchanged water while vigorously stirring and extracted with 300 ml of ethyl acetate. The ethyl acetate solution was washed with water, dried over magnesium sulfate and then concentrated under reduced pressure. The resulting concentrate was purified by column chromatography (filler: silica gel, eluent: hexane/ethyl acetate=4/1) and 21.7 g of a colorless liquid was obtained. This liquid was verified by NMR to be the material monomer as Structure (b23) of the present invention.

Compound (ii)

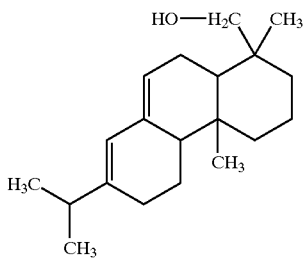

SYNTHESIS EXAMPLE 8

Synthesis of Material Monomer as Structure (b25)

27.2 g of a colorless liquid was obtained in the same manner as in Synthesis Example 6 except for using 38.8 g (0.10 mol) of Compound (iii) shown below (3β-cholestalol) in place of Compound (ii) in Synthesis Example 7. This liquid was verified by NMR to be the material monomer as Structure (b25) of the present invention.

Compound (iii)

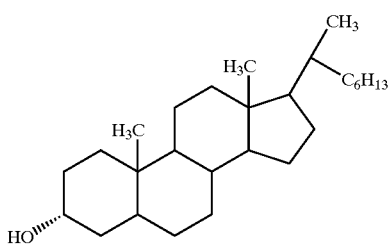

SYNTHESIS EXAMPLE 9

Synthesis of Material Monomer as Structure (b27)

25.4 g of white powder was obtained in the same manner as in Synthesis Example 6 except for using 37.7 g (0.10 mol) of Compound (iv) shown below (deoxycholic acid) in place of Compound (ii) in Synthesis Example 7. This liquid was verified by NMR to be the material monomer as Structure (b27) of the present invention.

Compound (iv)

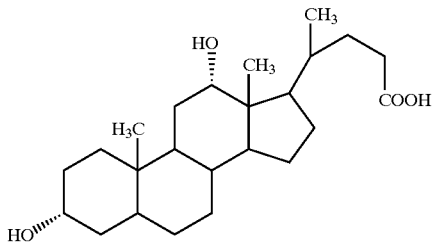

SYNTHESIS EXAMPLE 10

Synthesis of Resin (P-1) of the Present Invention Comprising Structure (a5)/Structure (a18)/Structure (b10)/Acrylonitrile The material monomers as Structure (a5)/Structure (a18)/Structure (b10) obtained in the Synthesis Examples above in an amount of 2.31 g (0.015 mol)/2.55 g (0.015 mol)/10.3 g (0.050 mol), respectively, and 1.06 g (0.020 mol) of acrylonitrile were dissolved in 60 ml of 1-methoxy-2-propanol. To the mixed solution, 50 mg of 2,2'-azobis(2,4-dimethylvaleronitrile) (V-65, trade name, produced by Wako Pure Chemical Industries Ltd.) as a polymerization initiator was added at 70° C. in a nitrogen stream while stirring. 50 mg of the initiator was further added 2 hours and 4 hours after the initiation of reaction. After reaction for further 3 hours, the temperature was elevated to 90° C. and stirring was continued for one hour. The reaction solution was allowed to cool-and then poured into 1 L of ion exchanged water while vigorously stirring. As a result, a polymer was precipitated. The polymer obtained was dried at 40° C. under reduced pressure to obtain 15 g of Resin (P-1) of the present invention. The molecular weight determined by GPC was, in terms of a weight average (Mw: polystyrene basis), $28.7 \times 10^3$ (dispersion degree (Mw/Mn): 2.6).

SYNTHESIS EXAMPLE 11

Synthesis of Resin (P-2) of the Present Invention Comprising Structure (a3)/Structure (a21)/Structure (b13)/Structure (c2)

The material monomers as Structure (a3)/Structure (a21)/Structure (b13) obtained in the Synthesis Examples above in an amount of 3.12 g (0.02 mol)/2.37 g (0.015 mol)/10.4 g (0.05 mol), respectively, and 1.29 g (0.015 mol) of methacrylic acid were dissolved in 60 ml of 1-methoxy-2-propanol. Thereafter, the reaction and the after-processing were performed in the same manner as in Synthesis Example 10 to obtain 16.1 g of Resin (P-2) of the present invention. The molecular weight determined by GPC was, in terms of a weight average (Mw: polystyrene basis), $32.5 \times 10^3$ (dispersion degree (Mw/Mn): 2.8).

SYNTHESIS EXAMPLE 12

Synthesis of Resin (P-3) of the Present Invention Comprising Structure (a5)/Structure (a21)/Structure (b25)/Structure (c2)

The material monomers as Structure (a5)/Structure (a21)/Structure (b25)/Structure (c2) obtained in the Synthesis Examples above in an amount of 2.31 g (0.015 mol)/3.16 g (0.020 mol)122.8 g (0.050 mol)/1.29 g (0.015 mol), respectively, were dissolved in 60 ml of 1-methoxy-2-propanol. Thereafter, the reaction and the after-processing were performed in the same manner as in Synthesis Example 10 to obtain 22.5 g of Resin (P-3) of the present invention. The molecular weight determined by GPC was, in terms of a weight average (Mw: polystyrene basis), $35.7 \times 10^3$ (dispersion degree (Mw/Mn): 2.8).

SYNTHESIS EXAMPLES 13 TO 19

Synthesis of Resins (P-4) to (P-10) of the Present Invention

The resins of the present invention were synthesized in the same manner as in Synthesis Examples 10 to 12 using the material monomers as the repeating structural units shown in Table 1. The structural unit used, the molar ratio of material monomers charged, and the weight-average molecular weight of the resin produced are together shown in Table 1 below. Resins P-9 and P-10 are-Comparative Examples.

TABLE 1

| Synthesis Example | Resin | Structural Unit | (mol % ratio) | Weight-Average Molecular weight |
|---|---|---|---|---|
| 10 | P-1 | a5/a18/b10/ acrylonitrile | 15/15/50/20 | $28.7 \times 10^3$ |
| 11 | P-2 | a3/a21/b13/c2 | 20/15/50/15 | $32.5 \times 10^3$ |
| 12 | P-3 | a5/a21/b25/c2 | 15/20/50/15 | $35.7 \times 10^3$ |
| 13 | P-4 | a4/a21/b25/c2 | 20/20/50/10 | $35.5 \times 10^3$ |
| 14 | P-5 | a12/a25/b22 | 35/35/30 | $50.5 \times 10^3$ |
| 15 | P-6 | a14/a27/b27 | 30/40/30 | $45.3 \times 10^3$ |
| 16 | P-7 | a1/a21/b10/c2 | 10/30/50/10 | $33.5 \times 10^3$ |
| 17 | P-8 | a1/a21/b10/c2 | 30/10/50/10 | $36.4 \times 10^3$ |
| 18 | P-9 | a1/b10/c2 | 40/50/10 | $39.7 \times 10^3$ |
| 19 | P-10 | a21/b10/c2 | 40/50/10 | $38.0 \times 10^3$ |

Example 1
(Determination of Optical Density)

Resins (P-1) to (P-8) of the present invention comprising a combination of the repeating monomer containing two kinds of acid decomposable groups and the repeating monomer containing a polycyclic-type alicyclic group, obtained in the Synthesis Examples above, resins (P-9) and (P-10) for comparison, and polyhydroxystyrene (Mw=15.1×10³) for comparison each as a sample polymer in an amount of 1.0 g was dissolved together with 0.03 g of a triflate salt of triphenylsulfonium in 4.5 g of propylene glycol monomethyl either acetate. The mixed solution was filtered through a Teflon filter of 0.2 μm, uniformly coated on a quartz glass substrate by a spin coater and dried by heating on a hot plate at 100° C. for 90 seconds to form a resist film having a thickness of 1 μm. The optical absorption of the film obtained was measured by an ultraviolet spectrophotometer and the optical density at 193 nm determined is shown in Table 2 below.

TABLE 2

| Resin-Used | Optical Density at 193 nm (/μm) | |
|---|---|---|
| P-1 | 0.36 | (Invention) |
| P-2 | 0.35 | (Invention) |
| P-3 | 0.40 | (Invention) |
| P-4 | 0.37 | (Invention) |
| P-5 | 0.37 | (Invention) |
| P-6 | 0.36 | (Invention) |
| P-7 | 0.38 | (Invention) |
| P-8 | 0.37 | (Invention) |
| P-9 | 0.39 | (Comparison) |
| P-10 | 0.38 | (Comparison) |
| poly(hydroxystyrene) | 1.5 or more | (Comparison) |

It is seen from Table 2 that the resins of the present invention are lower in the optical density measured than poly(hydroxystyrene) for comparison and proved to have a sufficiently high transmissivity to the light at 193 nm. (The mixing ratio was changed for the preparation of the Example later and this has no particular meaning in the measurement of the optical density.)

Example 2
(Measurement of Resistance Against Dry Etching)

The resist compositions prepared in the same manner as in Example 1 by mixing the resin, photo acid generator and the like each was filtered through a Teflon filter of 0.2 μm, uniformly coated on a silicon substrate by a spin coater and then dried by heating on a hot plate at 100° C. for 90 seconds to form a resist film having a thickness of 0.7 μm. The film obtained was measured on the etching rate to $CF_4/O_2$ (8/2) gas using a reactive ion etching apparatus (CSE-1110, manufactured by ULVAC) and the results are shown in Table 3 below (etching condition: power: 500 W, pressure: 4.6 Pa, gas flow rate: 10 sccm).

TABLE 3

| Resin Used | Etching Rate (Å/min) | Remarks |
|---|---|---|
| P-1 | 830 | Invention |
| P-2 | 790 | Invention |
| P-3 | 800 | Invention |
| P-4 | 730 | Invention |
| P-5 | 690 | Invention |
| P-6 | 700 | Invention |
| P-7 | 820 | Invention |
| P-8 | 830 | Invention |
| P-9 | 850 | Comparison |
| P-10 | 860 | Comparison |
| poly(methyl methacrylate) | 1250 | Comparison |

It is seen from Table 3 that the resins of the present invention are fully low in the etching rate as compared with poly(methyl methacrylate) (Mw=35.5×10³) for comparison and proved to have a sufficiently high resistance against dry etching.

Example 3
(Evaluation of Image)

The photoresist compositions of Example 2 each was uniformly coated on a silicon substrate treated with hexamethyl disilazane by a spin coater and then dried by heating on a hot plate at 100° C. for 90 seconds to form a resist film having a thickness of 0.4 μm. On the thus formed resist film, a mask prepared by drawing a pattern on a quartz plate by chromium was tightly contacted and thereon an ArF excimer laser beam (193 nm) was irradiated. Immediately after the exposure, the coating was heated on a hot plate at 110° C. for 60 minutes, developed by dipping it in a 2.0% aqueous tetramethylammonium hydroxide solution at 23° C. for 60 seconds, and then rinsed with pure water for 30 seconds.

The pattern obtained was observed through a scanning-type electron microscope and patterns in the rectangular form were evaluated good.

The sensitivity was defined by the exposure amount necessary for reproducing a mask pattern of 0.35 μm.

The resolution was defined by the limiting resolution with the exposure amount necessary for reproducing a mask pattern of 0.35 μm.

As a result, good positive patterns where only the exposed area of the resist film was dissolved and removed were formed with the sensitivity and resolution shown in Table 4.

TABLE 4

| Resin Used | Sensitivity (mJ/cm²) | Resolution (μm) | Pattern Profile (immediately after exposure) | (after 60 minutes) | Remarks |
|---|---|---|---|---|---|
| P-1 | 28 | 0.25 | ○ | ○ | Invention |
| P-2 | 30 | 0.25 | ○ | ○ | Invention |
| P-3 | 27 | 0.25 | ○ | ○ | Invention |
| P-4 | 35 | 0.25 | ○ | ○ | Invention |
| P-5 | 26 | 0.23 | ○ | ○ | Invention |
| P-6 | 25 | 0.23 | ○ | ○ | Invention |
| P-7 | 22 | 0.25 | ○ | ○ | Invention |
| P-8 | 31 | 0.25 | ○ | ○ | Invention |

TABLE 4-continued

| Resin Used | Sensitivity (mJ/cm$^2$) | Resolution ($\mu$m) | Pattern Profile (immediately after exposure) | (after 60 minutes) | Remarks |
|---|---|---|---|---|---|
| P-9 | 34 | 0.25 | o | x (T-top) | Comparison |
| P-10 | 28 | 0.25 | o | x (pattern thinning) | Comparison |

It is seen from the results in Table 4 that the resists using the acid decomposable groups mixture-type resin of the present invention have good sensitivity and resolution, and particularly give good pattern shape.

SYNTHESIS EXAMPLE 20
Synthesis of Resin of the Present Invention (Resin C: P-11) comprising Structure (a5)/Structure (b10)/Structure (c2)/Acrylonitrile The material monomers as Structure (a5)/Structure (b10)/Structure (c2) obtained in the Synthesis Examples above in an amount of 3.85 g (0.025 mol)/10.3 g (0.050 mol)/0.086 g (0.010 mol), respectively, and 0.080 g (0.015 mol) of acrylonitrile were dissolved in 60 ml of 1-methoxy-2-propanol. To the mixed solution, 50 mg of 2,2'-azobis(2,4-dimethylvaleronitrile) (V-65, trade name, produced by Wako Pure Chemical Industries Ltd.) as a polymerization initiator was added at 70° C. in a nitrogen stream while stirring. 50 mg of the same initiator was further added 2 hours and 4 hours after the initiation of reaction. After reaction for further 3 hours, the temperature was elevated to 90° C. and stirring was continued for one hour. The reaction solution was allowed to cool and then poured into 1 L of ion exchanged water while vigorously stirring. As a result, a polymer was precipitated. The polymer obtained was dried at 40° C. under reduced pressure to obtain 13.9 g of Resin (P-11) of the present invention. The molecular weight determined by GPC was, in terms of the weight average (Mw: polystyrene basis), 26.5×10$^3$ (dispersion degree (Mw/Mn): 2.6).

SYNTHESIS EXAMPLE 21
Synthesis of Resin of the Present Invention (Resin D: P-12) Comprising Structure (a18)/Structure (b13)/Structure (c2)

The material monomers as Structure (a18)/Structure (b13) obtained in the Synthesis Examples above in an amount of 5.96 g (0.035 mol)/17.7 g (0.050 mol), respectively, and 1.29 g (0.015 mol) of methacrylic acid were dissolved in 60 ml of 1-methoxy-2-propanol. Thereafter, the reaction and the after-processing were performed in the same manner as in Synthesis Example 20 to obtain 16.7 g of Resin (P-12) of the present invention. The molecular weight determined by GPC was, in terms of the weight average (Mw: polystyrene basis), 33.6×10$^3$ (dispersion degree (Mw/Mn): 2.8).

SYNTHESIS EXAMPLE 22
Synthesis of Resin of the Present Invention (Resin D: P-13) Comprising Structure (a21)/Structure (b25)/Structure (c2)

The material monomers as Structure (a21)/Structure (b25) obtained in the Synthesis Examples above in an amount of 5.53 g (0.035 mol)/22.8 g (0.050 mol), respectively, and 1.29 g (0.015 mol) of methacrylic acid were dissolved in 60 ml of 1-methoxy-2-propanol. Thereafter, the reaction and the after-processing were performed in the same manner as in Synthesis Example 20 to obtain 23.1 g of Resin (P-13) of the present invention. The molecular weight determined by GPC was, in terms of the weight average (Mw: polystyrene basis), 36.5×10$^3$ (dispersion degree (Mw/Mn): 2.8).

SYNTHESIS EXAMPLES 23 TO 29
Synthesis of Resins (P-14) to (P-20) of the Invention The resins of the present invention were synthesized, in the same manner as in Synthesis Examples 20 to 22 using the material monomers as the repeating structural units shown in Table 5 below. The structural unit used, the molar ratio of material monomers charged, and the weight-average molecular weight of the resin produced are together shown in Table 5 below.

TABLE 5

| Synthesis Example | Resin Type | | Structural Unit | (mol % ratio) | Weight-Average Molecular Weight |
|---|---|---|---|---|---|
| 20 | P-11 | C | a5/b10/c2/acrylonitrile | 25/50/10/15 | 26.5 × 10$^3$ |
| 21 | P-12 | D | a18/b13/c2 | 35/50/15 | 33.6 × 10$^3$ |
| 22 | P-13 | D | a21/b25/c2 | 35/50/15 | 36.5 × 10$^3$ |
| 23 | P-14 | C | a4/b19/c2 | 30/50/20 | 25.5 × 10$^3$ |
| 24 | P-15 | C | a9/b10/c2 | 35/50/15 | 51.5 × 10$^3$ |
| 25 | P-16 | C | a12/b22 | 65/35 | 35.3 × 10$^3$ |
| 26 | P-17 | D | a25/b22 | 65/35 | 38.7 × 10$^3$ |
| 27 | P-18 | C | a14/b27 | 70/30 | 34.4 × 10$^3$ |
| 28 | P-19 | D | a27/b27 | 70/30 | 40.7 × 10$^3$ |
| 29 | P-20 | D | a21/b19/c5 | 35/50/15 | 37.6 × 10$^3$ |

Example 4
(Determination of Optical Density)

Resins (C) and (D) of the present invention obtained in the Synthesis Examples above, in a total amount of 1.0 g with the mixing ratio being varied as shown in Table 6, and 0.03 g of a triflate salt of triphenylsulfonium were dissolved in 4.5 g of propylene glycol monomethyl ether acetate. The mixed solution was filtered through a Teflon filter of 0.2 $\mu$m, uniformly coated on a quartz glass substrate by a spin coater and dried by heating on a hot plate at 100° C. for 90 seconds to form a resist film having a thickness of 1 $\mu$m. The optical absorption of the film obtained was measured by an ultraviolet spectrophotometer and the optical density at 193 nm determined is shown in Table 6 below.

TABLE 6

| Resins Used | Mixing Ratio | Optical Density at 193 nm (/$\mu$m) |
|---|---|---|
| P-11/P-12 | 50/50 | 0.37 |
| P-14/P-20 | 100/0 | 0.36 |
| P-14/P-20 | 80/20 | 0.35 |
| P-14/P-20 | 50/50 | 0.35 |
| P-14/P-20 | 20/80 | 0.35 |
| P-14/P-20 | 0/100 | 0.35 |
| P-16/P-17 | 50/50 | 0.34 |
| P-18/P-19 | 50/50 | 0.37 |
| P-13/P-15 | 40/60 | 0.38 |
| poly(hydroxystyrene) | | 1.5 or more (Comparison) |

It is seen from the results in Table 6 that the resins of the present invention are lower in the optical density measured than poly(hydroxystyrene) (Mw=15.1×10$^3$) for comparison and proved to have a sufficiently high transmissibility to the light at 193 nm. (The mixing ratio was changed for the preparation of the Example later and this has no particular meaning in the measurement of the optical density.)

Example 5

(Measurement of Resistance against Dry Etching)

The resist compositions prepared in the same manner as in Example 4 by mixing the resins, photo acid generator and the like each was filtered through a Teflon filter of 0.2 μm, uniformly coated on a silicon substrate by a spin coater and then dried by heating on a hot plate at 100° C. for 90 seconds to form a resist film having a thickness of 0.7 μm. The film obtained was measured on the etching rate to $CF_4/O_2$ (8/2) gas using a reactive ion etching apparatus (CSE-1110, manufactured by ULVAC) and the results are shown in Table 7 below (etching condition: power: 500 W, pressure: 4.6 Pa, gas flow rate: 10 sccm).

TABLE 7

| Resins Used | Mixing Ratio | Etching Rate (Å/min) | Remarks |
| --- | --- | --- | --- |
| P-11/P-12 | 50/50 | 810 | Invention |
| P-14/P-20 | 100/0 | 780 | Comparison |
| P-14/P-20 | 80/20 | 770 | Invention |
| P-14/P-20 | 50/50 | 770 | Invention |
| P-14/P-20 | 20/80 | 760 | Invention |
| P-14/P-20 | 0/100 | 760 | Comparison |
| P-16/P-17 | 50/50 | 680 | Invention |
| P-18/P-19 | 50/50 | 700 | Invention |
| P-13/P-15 | 40/60 | 800 | Invention |
| poly(methyl methacrylate) | | 1250 | Comparison |

It is seen from Table 7 that the resins of the present invention are fully low in the etching rate as compared with poly(methyl methacrylate) (Mw=35.5×10³) for comparison and proved to have a sufficiently high resistance against dry etching.

Example 8

(Evaluation of Image)

The photoresist compositions of Example 5 each was uniformly coated on a silicon substrate treated with hexamethyl disilazane by a spin coater and then dried by heating on a hot plate at 100° C. for 90 seconds to form a resist film having a thickness of 0.4 μm. On the thus formed resist film, a mask prepared by drawing a pattern on a quartz plate by chromium was tightly contacted an thereon and ArF excimer laser beam (193 nm) was irradiated. Immediately after the exposure, the coating was heated on a hot plate at 110° C. for 60 minutes, developed by dipping it in a 2.0% aqueous tetramethylammonium hydroxide solution at 23° C. for 60 seconds, and then rinsed with pure water for 30 seconds.

The pattern obtained was observed through a scanning-type electron microscope and patterns in the rectangular form were evaluated good.

The sensitivity was defined by the exposure amount necessary for reproducing a mask pattern of 0.35 μm.

The resolution was defined by the limiting resolution with the exposure amount necessary for reproducing a mask pattern of 0.35 μm.

As a result, good positive patterns where only the exposed area of the resist film was dissolved and removed were formed with the sensitivity and resolution shown in Table 8.

TABLE 8

| Resin Used | Mixing Ratio | Sensitivity (mJ/cm²) | Resolution (μm) | Pattern Profile immediately after exposure | Pattern Profile after 60 minutes | Remarks |
| --- | --- | --- | --- | --- | --- | --- |
| P-11/P-12 | 50/50 | 30 | 0.25 | ○ | ○ | Invention |
| P-14/P-20 | 100/0 | 40 | 0.28 | ○ | × (T-top) | Comparison |
| P-14/P-20 | 80/20 | 35 | 0.25 | ○ | ○ | Invention |
| P-14/P-20 | 50/50 | 29 | 0.25 | ○ | ○ | Invention |
| P-14/P-20 | 20/80 | 26 | 0.25 | ○ | ○ | Invention |
| P-14/P-20 | 0/100 | 25 | 0.25 | ○ | × (thinning of pattern) | Comparison |
| P-16/P-17 | 50/50 | 25 | 0.23 | ○ | ○ | Invention |
| P-18/P-19 | 50/50 | 24 | 0.23 | ○ | ○ | Invention |
| P-13/P-15 | 40/60 | 29 | 0.25 | ○ | ○ | Invention |

It is seen from the results in Table 8 that the resists using a mixture of Resins B and C of the present invention have good sensitivity and resolution, and particularly give good pattern shape.

As apparent from the foregoing, the positive photosensitive composition using a resin containing two or more kinds of repeating structural units having an acid decomposable group and a structural unit having a polycyclic-type alicyclic group, and the positive photosensitive composition using a mixture of Resin C and Resin D of the present invention form an excellent pattern profile particularly with the far ultraviolet light of 220 nm or less and have high transmissibility and good dry etching resistance. In particular, when an ArF excimer laser light is used as the exposure light source, high sensitivity, high resolution and good pattern profile are obtained and thus, the positive photosensitive compositions of the present invention can be effectively used in the formation of a fine pattern necessary for producing a semiconductor device.

What is claimed is:

1. A positive photosensitive composition comprising:

(A) a compound generating an acid on irradiation of an active light ray or radiation, and (B) a resin having (i) at least one polycyclic alicyclic group, (ii) at least one group which decomposes by the action of an acid represented by formula (I) and increases the solubility in an alkali developer, and (iii) at least one group which decomposes by the action of an acid represented by formula (II) and increases the solubility in an alkali developer:

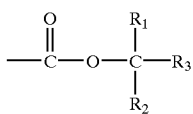
(I)

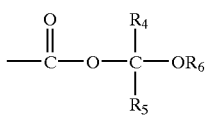
(II)

wherein $R_1$ to $R_5$, which may be the same or different, each represents a hydrogen atom or an alkyl group, cycloalkyl group, alkenyl group, acyl group or alkoxycarbonyl group which may have a substituent, $R_6$ represents an alkyl group, cycloalkyl group or alkenyl group which may have a substituent, provided that two of $R_1$ to $R_3$ in formula (I) or two of $R_4$ to $R_6$ in formula (II) may be combined to form a ring structure comprising from 3 to 8 carbon atoms or heterocyclic atoms and the molar ratio of the group represented by formula (I) to the group represented by formula (II) in resin (B) is from 20:80 to 80:20.

2. The positive photosensitive composition as claimed in claim 1, wherein the resin as component (B) is a resin containing (i) a repeating structural unit having a polycyclic alicyclic group, (ii) at least one repeating structural unit represented by formula (III), (IV) or (V), and (iii) at least one repeating structural unit represented by formula (VI), (VII) or (VIII):

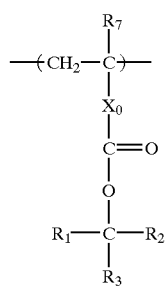
(III)

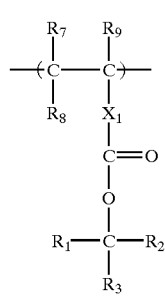
(IV)

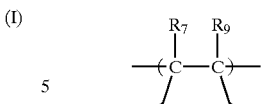
(V)

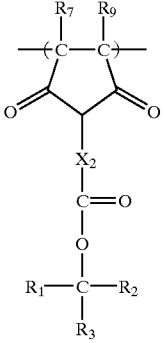
(VI)

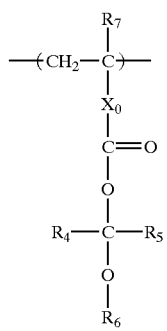
(VII)

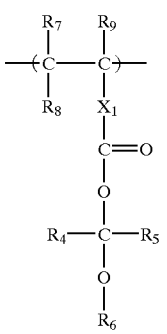
(VIII)

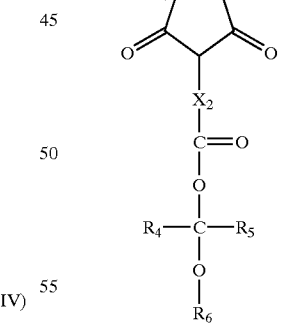

wherein $R_7$ and $R_9$, which may be the same or different, each represents a hydrogen atom, a halogen atom, a cyano group, an alkyl group or a haloalkyl group; $R_8$ represents a cyano group, $-CO-OR_{10}$ or $-CO-NR_{11}R_{12}$; $R_{10}$ to $R_{12}$, which may be the same or different, each represents a hydrogen atom or an alkyl group, cycloalkyl group or alkenyl group which may have a substituent, and $R_{11}$ and $R_{12}$ may be combined to form a ring; $X_0$ to $X_2$, which may be the same or different, each represents a single bond or a divalent alkylene group, alkenylene group or cycloalkylene group which may have a substituent, —O—, —SO$_2$—, —O—CO—R$_{13}$—, —CO—O—R$_{14}$— or —CO—NR$_{15}$—R$_{16}$—; R$_{13}$, R$_{14}$ and R$_{16}$, which may be the same or different, each represents a single bond or a divalent alkylene group, alkenylene group or cycloalkylene group, and these groups each may further form a divalent group together with an ether group, an ester group, an amido group, a urethane group or a ureido group; R$_{15}$ represents a hydrogen atom or an alkyl group, cycloalkyl group or alkenyl group which may have a substituent; and R$_1$ to R$_6$ have the same meanings as in claim 1.

3. The positive photosensitive composition as claimed in claim 1 or 2, wherein the resin as component (B) further has a carboxyl group.

4. The positive photosensitive composition as claimed in claim 3, wherein the resin as component (B) is a resin further containing at least one repeating structural unit represented by formula (IX), (X) or (XI) having a carboxyl group:

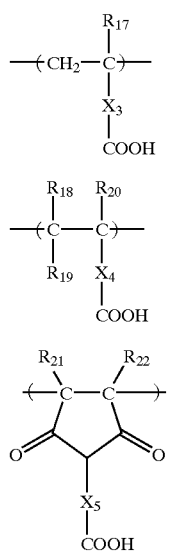

wherein R$_{17}$, R$_{18}$ and R$_{20}$ to R$_{22}$, which may be the same or different, each represents a hydrogen atom, a halogen atom, a cyano group, an alkyl group or a haloalkyl group; R$_{19}$ represents a cyano group, a carboxyl group, —CO—OR$_{23}$ or —CO—NR$_{24}$R$_{25}$; X$_3$ to X$_5$, which may be the same or different, each represents a single bond, a divalent alkylene group, alkenylene group or cycloalkylene group which may have a substituent, —O—, —SO$_2$—, —O—CO—R$_{26}$—, —CO—O—R$_{27}$— or —CO—NR$_{28}$—R$_{29}$—; R$_{23}$ represents an alkyl group, cycloalkyl group or alkenyl group which may have a substituent; R$_{24}$, R$_{25}$ and R$_{28}$, which may be the same or different, each represents a hydrogen atom or an alkyl group, cycloalkyl group or alkenyl group which may have a substituent and R$_{24}$ and R$_{25}$ may be combined to form a ring; and R$_{26}$, R$_{27}$ and R$_{29}$, which may be the same or different, each represents a single bond, a divalent alkylene group, alkenylene group or cycloalkylene group, and these groups each may further form a divalent group together with an ether group, an ester group, an amido group, a urethane group or a ureido group.

5. The positive photosensitive composition as claimed in claim 1, further comprising a low molecular acid decomposable dissolution inhibiting compound having a group capable of decomposition by the action of an acid, being increased in the solubility in an alkali developer by the action of an acid and having a molecular weight of 3,000 or less.

6. The positive photosensitive composition as claimed in claim 1, which is used for an exposure using a far ultraviolet light of 250 nm or less as the exposure light source.

7. The positive photosensitive composition as claimed in claim 1, which is used for an exposure using a far ultraviolet light of 220 nm or less as the exposure light source.

8. A positive photosensitive composition comprising (A) a compound generating an acid on irradiation of an active light ray or radiation, (C) a resin having a polycyclic alicyclic group and a group which decomposes by the action of an acid represented by formula (I) and increases the solubility in an alkali developer, and (D) a resin having a polycyclic alicyclic group and a group which decomposes by the action of an acid represented by formula (II) and increases the solubility in an alkali developer:

wherein R$_1$ to R$_5$, which may be the same or different, each represents a hydrogen atom or an alkyl group, cycloalkyl group, alkenyl group, acyl group or alkoxycarbonyl group which may have a substituent, R$_6$ represents an alkyl group, cycloalkyl group or alkenyl group which may have a substituent, provided that two of R$_1$ to R$_3$ in formula (I) or two of R$_4$ to R$_6$ in formula (II) may be combined to form a ring structure comprising from 3 to 8 carbon atoms or heterocyclic atoms, and the mixing ratio of resin (C) to resin (D) in the resist composition is from 20/80 to 80/20.

9. The positive photosensitive composition as claimed in claim 8, wherein the resin as component (C) is a resin containing a repeating structural unit having a polycyclic alicyclic group and at least one repeating structural unit represented by formula (III), (IV) or (V), and the resin as component (D) is a resin containing a repeating structural unit having a polycyclic alicyclic group and at least one repeating structural unit represented by formula (VI), (VII) or (VIII):

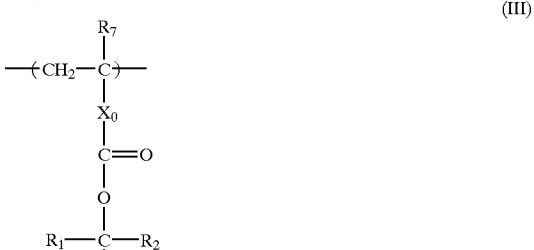

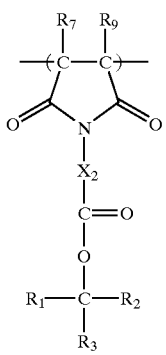

(V)

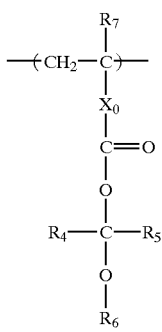

(VI)

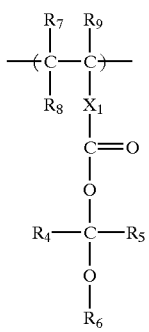

(VII)

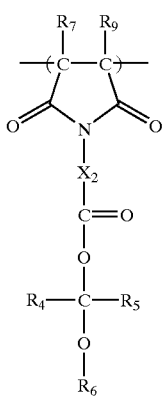

(VIII)

wherein $R_7$ and $R_9$, which may be the same or different, each represents a hydrogen atom, a halogen atom, a cyano group, an alkyl group or a haloalkyl group; $R_8$ represents a cyano group, —CO—$OR_{10}$ or —CO—$NR_{11}R_{12}$; $R_{10}$ to $R_{12}$, which may be the same or different, each represents a hydrogen atom or an alkyl group, cycloalkyl group or alkenyl group which may have a substituent, and $R_{11}$ and $R_{12}$ may be combined to form a ring; $X_0$ to $X_2$, which may be the same or different, each represents a single bond or an alkylene group, alkenylene group or cycloalkylene group which may have a substituent, —O—, —$SO_2$—, —O—CO—$R_{13}$—, —CO—O—$R_{14}$— or —CO—$NR_{15}$—$R_{16}$—; $R_{13}$, $R_{14}$ and $R_{16}$, which may be the same or different, each represents a single bond or a divalent alkylene group, alkenylene group or cycloalkylene group, and these groups each may further form a divalent group together with an ether group, an ester group, an amido group, a urethane group or a ureido group; $R_{15}$ represents a hydrogen atom or an alkyl group, cycloalkyl group or alkenyl group which may have a substituent; and $R_1$ to $R_6$ have the same meanings as in claim 8.

10. The positive photosensitive composition as claimed in claim 8 or 9, wherein either one or both of resins as components (C) and (D) further has a carboxyl group.

11. The positive photosensitive composition as claimed in claim 10, wherein either one or both of resins as components (C) and (D) further contains at least one repeating structural unit represented by the following formula (IX), (X) or (XI) having a carboxyl group:

(IX)

(X)

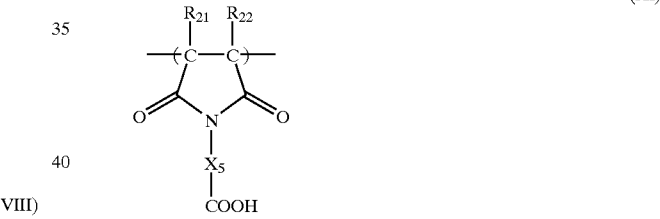

(XI)

wherein $R_{17}$, $R_{18}$ and $R_{20}$ to $R_{22}$, which may be the same or different, each represents a hydrogen atom, a halogen atom, a cyano group, an alkyl group or a haloalkyl group; $R_{19}$ represents a cyano group, a carboxyl group, —CO—$OR_{23}$ or —CO—$NR_{24}R_{25}$; $X_3$ to $X_5$, which may be the same or different, each represents a single bond, a divalent alkylene group, alkenylene group or cycloalkylene group which may have a substituent, —O—, —$SO_2$—, —O—CO—$R_{26}$—, —CO—O—$R_{27}$— or —CO—$NR_{28}$—$R_{29}$—; $R_{23}$ represents an alkyl group, cycloalkyl group or alkenyl group which may have a substituent; $R_{24}$, $R_{25}$ and $R_{28}$, which may be the same or different, each represents a hydrogen atom or an alkyl group, cycloalkyl group or alkenyl group which may have a substituent and $R_{24}$ and $R_{25}$ may be combined to form a ring; and $R_{26}$, $R_{27}$ and $R_{29}$, which may be the same or different, each represents a single bond or a divalent alkylene group, alkenylene group or cycloalkylene group, and these groups each may further form a divalent group together with an ether group, an ester group, an amido group, a urethane group or a ureido group.

12. The positive photosensitive composition as claimed in claim 8, further comprising a low molecular acid decomposable dissolution inhibiting compound having a group capable of decomposition by the action of an acid, being increased in the solubility in an alkali developer by the action of an acid and having a molecular weight of 3,000 or less.

13. The positive photosensitive composition as claimed in claim 8, which is used for an exposure using a far ultraviolet light of 250 nm or less as the exposure light source.

14. The positive photosensitive composition as claimed in claim 8, which is used for an exposure using a far ultraviolet light of 220 nm or less as the exposure light source.

* * * * *